United States Patent
Sakurai et al.

(10) Patent No.: US 9,264,642 B2
(45) Date of Patent: Feb. 16, 2016

(54) IMAGING DEVICE, IMAGING SYSTEM, AND METHOD FOR DRIVING IMAGING DEVICE FOR GENERATING AND CONVERTING SIGNALS BASED ON PHOTOELECTRIC AND NOISE

(71) Applicant: CANON KABUSHIKI KAISHA, Tokyo (JP)

(72) Inventors: Katsuhito Sakurai, Machida (JP); Seiji Hashimoto, Yokohama (JP); Atsushi Furubayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 86 days.

(21) Appl. No.: 13/776,509

(22) Filed: Feb. 25, 2013

(65) Prior Publication Data

US 2013/0222662 A1 Aug. 29, 2013

(30) Foreign Application Priority Data

Feb. 28, 2012 (JP) .................... PCT/JP2012/054978

(51) Int. Cl.
*H04N 3/14* (2006.01)
*H04N 5/335* (2011.01)
*H04N 5/378* (2011.01)
*H04N 5/365* (2011.01)
*H04N 5/3745* (2011.01)
*H01L 27/146* (2006.01)

(52) U.S. Cl.
CPC .......... *H04N 5/378* (2013.01); *H01L 27/14641* (2013.01); *H04N 5/365* (2013.01); *H04N 5/37457* (2013.01)

(58) Field of Classification Search
CPC .... H04N 5/378; H04N 5/37457; H04N 5/365
USPC .................................. 348/302, 308
See application file for complete search history.

(56) References Cited

U.S. PATENT DOCUMENTS

| | | | | |
|---|---|---|---|---|
| 4,195,360 A | * | 3/1980 | Fothergill | G01S 3/8083 367/136 |
| 6,021,172 A | * | 2/2000 | Fossum et al. | 377/60 |
| 2004/0080645 A1 | * | 4/2004 | Shinohara | 348/301 |
| 2011/0248149 A1 | * | 10/2011 | Sato et al. | 250/214 P |
| 2013/0020471 A1 | * | 1/2013 | Korekado et al. | 250/208.1 |

FOREIGN PATENT DOCUMENTS

| | | |
|---|---|---|
| JP | 2004-134867 A | 4/2004 |
| JP | 2011-217206 A | 10/2011 |
| JP | 2011-223270 A | 11/2011 |
| JP | 2011-259485 A | 12/2011 |
| JP | 2012-39386 A | 2/2012 |

* cited by examiner

*Primary Examiner* — Antoinette Spinks
(74) *Attorney, Agent, or Firm* — Canon USA, Inc. I.P. Division

(57) ABSTRACT

Conventionally, in order to obtain a difference signal between an A+N signal and an N signal and a difference signal between an A+B+N signal and the A+N signal, the A+N signal needs to be held in two different capacitors. Hence, there is a problem in that, due to variations in capacitance of the two capacitors, the difference signal between the A+N signal and the N signal and the difference signal between the A+B+N signal and the A+N signal may not accurately be obtained. An imaging device generates a signal obtained by subtracting the same digital N signal from each of the digital A+N signal and the digital A+B+N signal.

15 Claims, 18 Drawing Sheets

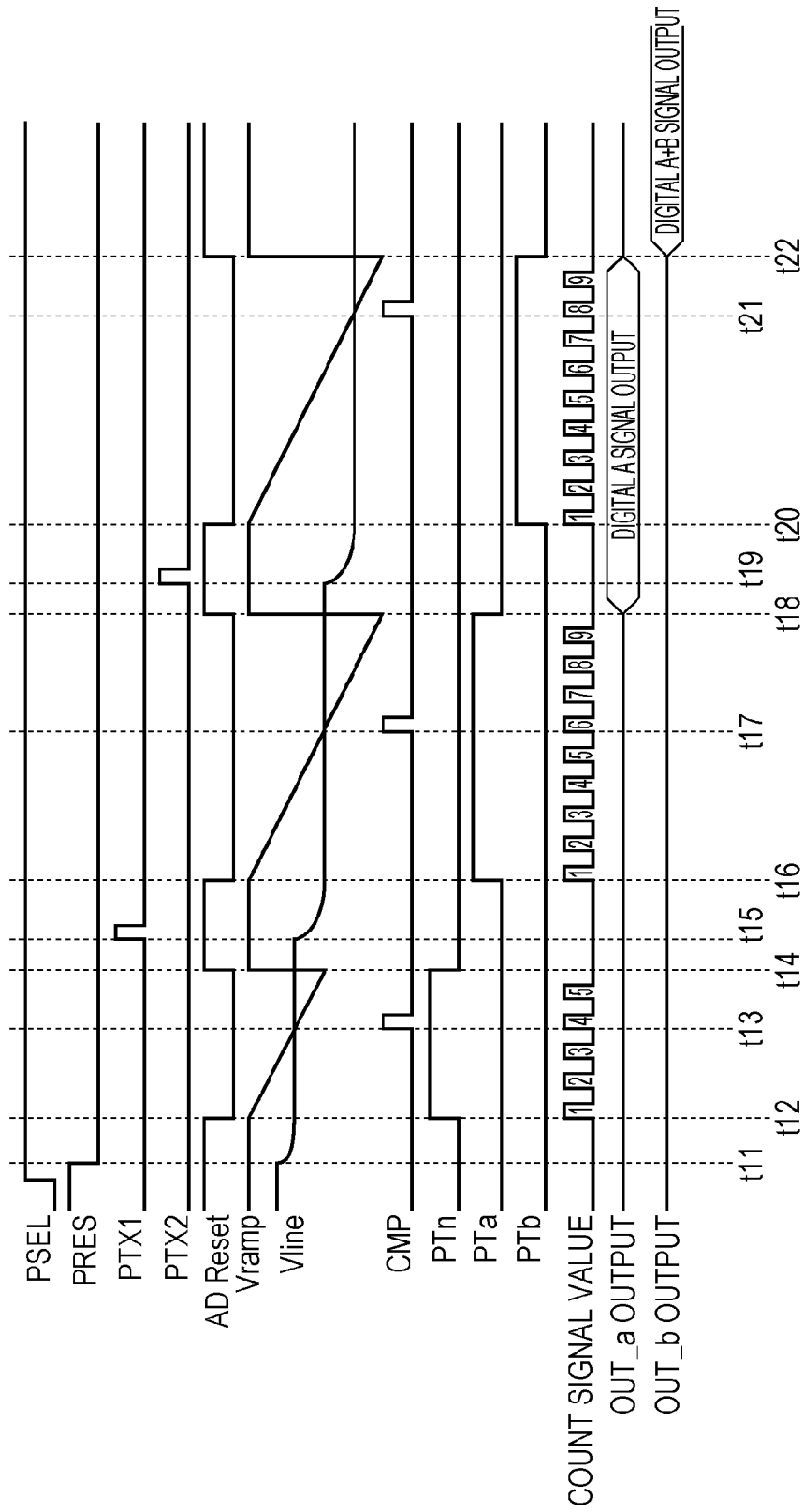

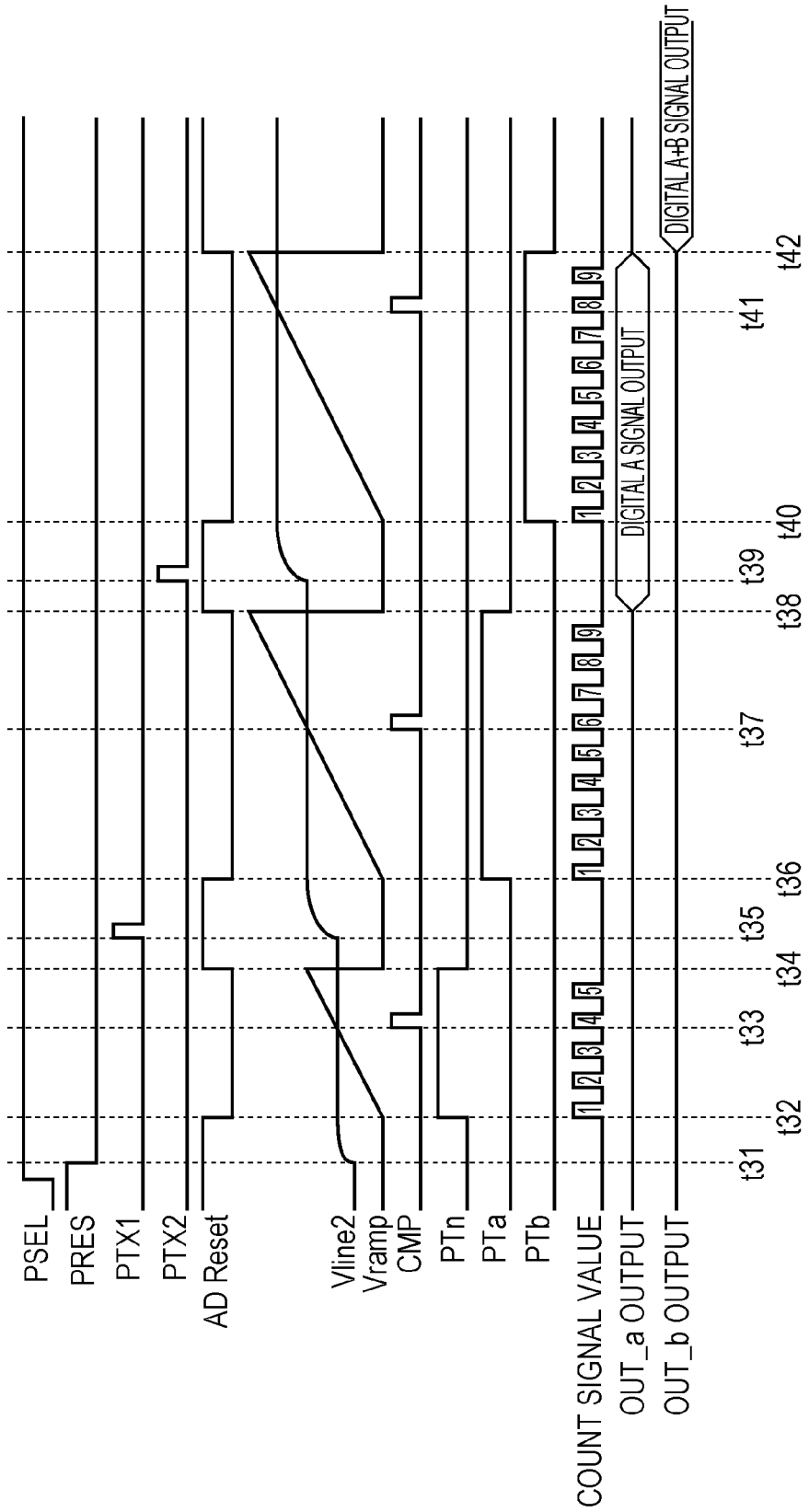

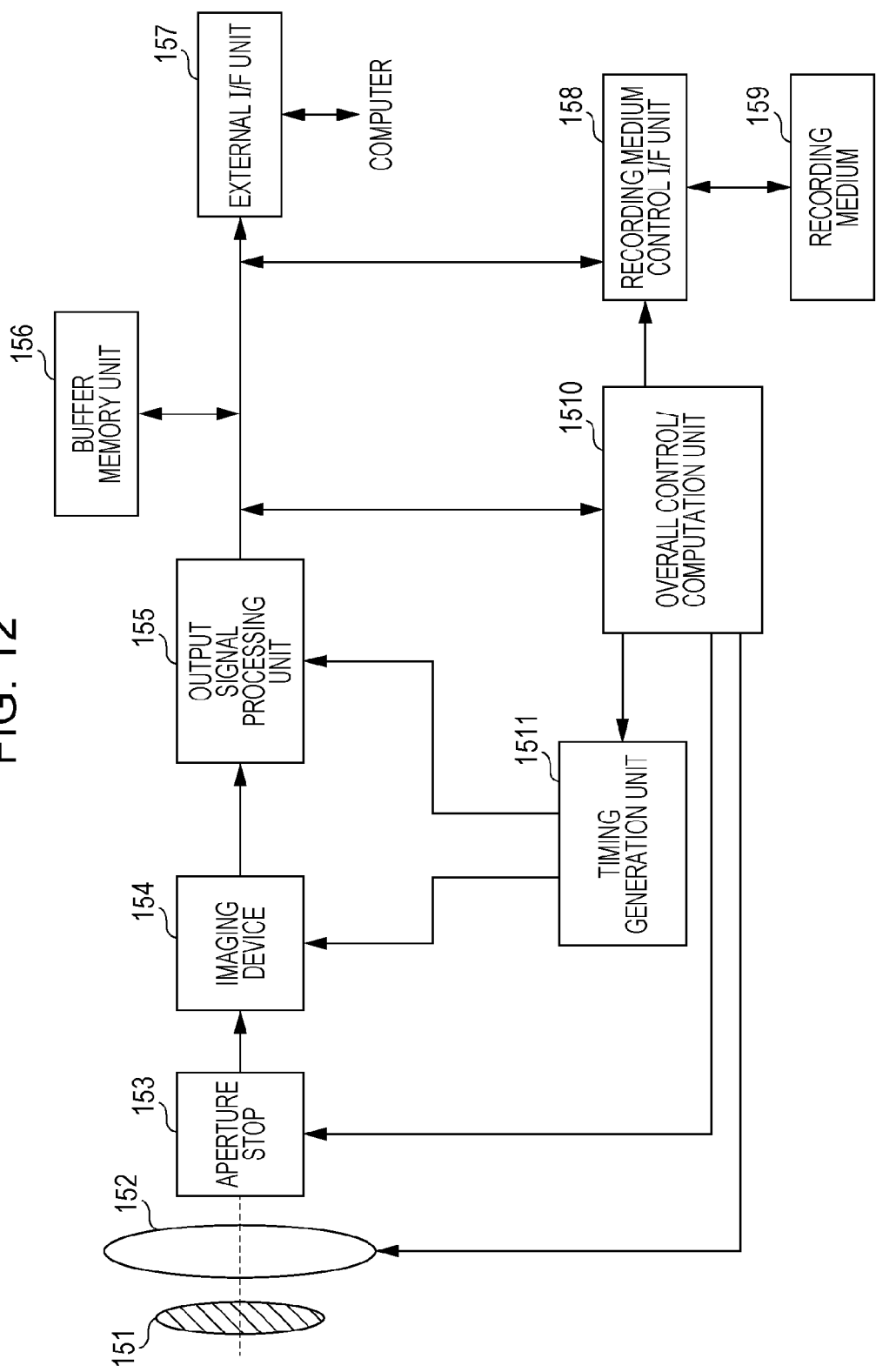

IMAGING DEVICE, IMAGING SYSTEM, AND METHOD FOR DRIVING IMAGING DEVICE FOR GENERATING AND CONVERTING SIGNALS BASED ON PHOTOELECTRIC AND NOISE

TECHNICAL FIELD

The present invention relates to an imaging device having pixels including a plurality of photoelectric conversion units, and an analog-digital conversion unit.

BACKGROUND ART

An imaging device including a pixel unit which performs photoelectric conversion and which has pixels arranged thereon in a matrix each configured to output a signal based on incident light, and a column-parallel analog-digital conversion unit in which an analog-digital conversion unit is located so as to correspond to each column of pixels (hereinafter, an analog-digital conversion unit is referred to as an ADC (Analog Digital Converter), and a column-parallel ADC is referred to as a column ADC) is conventionally known. In the column ADC, a circuit unit for each column performs analog-digital conversion (hereinafter referred to as AD conversion) to convert analog signals output from the pixels (an analog signal output from a pixel is hereinafter referred to as a pixel signal) into digital signals.

PTL 1 describes an imaging device including a pixel having a plurality of photoelectric conversion units that convert optical signals into signal charge and accumulate the signal charge and one amplification MOS transistor that, upon receiving signal charge from each of the plurality of photoelectric conversion units, outputs a signal corresponding to the signal charge. A pixel 1 described in PTL 1 outputs to a vertical signal line a first signal with a noise level (hereinafter referred to as an N signal) which is output from the pixel, a second signal (hereinafter referred to as an A+N signal) based on first signal charge to be accumulated in at least one photoelectric conversion unit, and a third signal (hereinafter referred to as an A+B+N signal) based on signal charge obtained by further adding signal charge to be accumulated in another photoelectric conversion unit to the first signal charge. The A+N signal is held in each of a first capacitor and a second capacitor which are electrically connected to the vertical signal line. The A+B+N signal is held in a third capacitor which is electrically connected to the vertical signal line 8.

CITATION LIST

Patent Literature

PTL 1 Japanese Patent Laid-Open No. 2004-134867

In the imaging device described in PTL 1, the A+N signal needs to be held in two different capacitors in order to obtain a difference signal between the A+N signal and the N signal and a difference signal between the A+B+N signal and the A+N signal. Hence, there is a problem in that, due to variations in capacitance of the two capacitors, the difference signal between the A+N signal and the N signal and the difference signal between the A+B+N signal and the A+N signal may not accurately be obtained.

SUMMARY OF INVENTION

An embodiment of the present invention has been made in view of the foregoing problem, and an aspect provides an imaging device including an analog signal output unit and an analog-digital conversion unit, the analog signal output unit including a pixel, the pixel having a photoelectric conversion unit, the analog signal output unit outputting a first signal that is a noise signal in the analog signal output unit, a second signal based on signal charge generated in the photoelectric conversion unit, and a third signal based on signal charge obtained by adding other signal charge generated in the photoelectric conversion unit to the signal charge, the analog-digital conversion unit converting each of the first, second, and third signals into a digital signal, the analog-digital conversion unit including a signal holding unit that holds the digital signal converted from the first signal.

Another aspect provides a method for driving an imaging device, the imaging device including an analog signal output unit and an analog-digital conversion unit, wherein the analog signal output unit includes a pixel, the pixel has a photoelectric conversion unit, the analog signal output unit outputs a first signal representing a noise signal in the analog signal output unit, a second signal based on signal charge generated in the photoelectric conversion unit, and a third signal based on signal charge obtained by adding other signal charge generated in the photoelectric conversion unit to the signal charge, and the analog-digital conversion unit converts the first, second, and third signals into digital signals.

Further, an aspect provides a method for driving an imaging system, the imaging system including an imaging device including a plurality of analog signal output units each including a pixel, analog-digital conversion units provided so as to correspond to the analog signal output units, and a microlens array having a plurality of microlenses, and an optical system that collects light onto the imaging device, the pixel including at least n (n is a natural number of 2 or more) photoelectric conversion units of photoelectric conversion units each provided so as to correspond to one of the microlenses, the method including a step in which the analog signal output unit outputs a first signal that is a noise signal in the analog signal output unit, a second signal based on signal charge generated by m (m is a natural number satisfying a relational expression of n>m) photoelectric conversion units among the n photoelectric conversion units, and a third signal based on signal charge generated by the n photoelectric conversion units, and the analog-digital conversion unit converts each of the first, second, and third signals into a digital signal; a first step in which the imaging device generates a first difference signal between the digital signal converted from the second signal and the digital signal converted from the first signal, and a second difference signal between the digital signal converted from the third signal and the digital signal converted from the first signal, by using the same digital signal converted from the first signal; and a second step of obtaining a third difference signal that is a difference between the first difference signal and the second difference signal, and performing focal point detection using the third difference signal and the first difference signal.

Further features of the present invention will become apparent from the following description of exemplary embodiments with reference to the attached drawings.

BRIEF DESCRIPTION OF DRAWINGS

FIG. 2 is a diagram illustrating an example of the operation of the imaging device.

FIG. 3B is a diagram illustrating an example of the operation of the imaging device in the other form.

FIG. 12 is a block diagram schematically illustrating an imaging system.

DESCRIPTION OF EMBODIMENTS

Exemplary Embodiment 1

An imaging device of this exemplary embodiment will be described hereinafter with reference to the drawings.

Figure 1A:
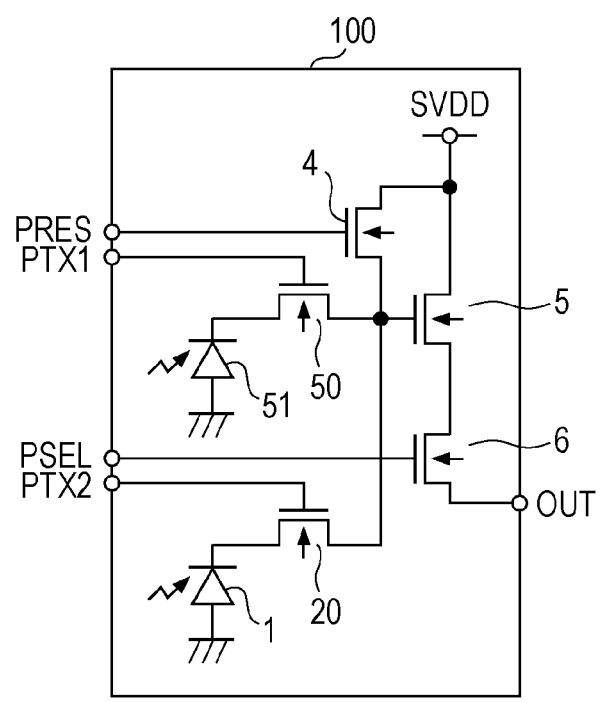
FIG. 1A is a diagram illustrating an example of an equivalent circuit of a pixel.

FIG. 1A illustrates an example of an equivalent circuit of a pixel according to this exemplary embodiment. Reference numerals 1 and 51 denote photoelectric conversion units. In this exemplary embodiment, the photoelectric conversion units are photodiodes. Reference numerals 20 and 50 denote transfer MOS transistors, reference numeral 4 denotes a reset MOS transistor, reference numeral 5 denotes an amplification MOS transistor, and reference numeral 6 denotes a selection MOS transistor. In the photodiodes 1 and 51, signal charge based on incident light is generated by photoelectric conversion. When a transfer pulse PTX1 to be supplied to a gate of the transfer MOS transistor 20 by a vertical scanning circuit (represented as VSC (Vertical Scanning Circuit) in FIG. 1B) 2 described below is set to a High level (hereinafter referred to as the H level). Similarly, a Low level is referred to as the L level), the signal charge held in the photodiode 1 is transferred to a gate of the amplification MOS transistor 5. The gate of the amplification MOS transistor 5 is a control electrode of the amplification MOS transistor 5. Similarly, when a transfer pulse PTX2 to be supplied to a gate of the transfer MOS transistor 50 by the vertical scanning circuit 2 is set to the H level, the signal charge held in the photodiode 51 is transferred to the gate of the amplification MOS transistor 5. When a reset pulse PRES to be supplied to a gate of the reset MOS transistor 4 by the vertical scanning circuit 2 is set to the H level, the potential of the gate of the amplification MOS transistor 5 is reset. The amplification MOS transistor 5 outputs an electrical signal based on the signal charge transferred to the gate thereof to the selection MOS transistor 6. The selection MOS transistor 6 outputs the signal output from the amplification MOS transistor 5 to a vertical signal line 7 when a selection pulse PSEL to be supplied to the gate thereof from the vertical scanning circuit 2 is at the H level. The signal output from a pixel 100 to the vertical signal line 7 corresponds to the pixel signal described above. A vertical signal line 7 for each column is supplied with a current from a current source 8. An analog signal output unit of this exemplary embodiment includes the pixel 100.

A signal to be output to the vertical signal line 7 based on the potential of the gate of the amplification MOS transistor 5, where the reset pulse PRES is set to the H level and then the L level, is represented as a PN signal. The PN signal is a noise signal output to the vertical signal line 7 when the potential of the gate of the amplification MOS transistor 5 has a reset level. The PN signal is a first signal to be output from the analog signal output unit including the pixel. Further, a signal to be output to the vertical signal line 7 based on the potential of the gate of the amplification MOS transistor 5 to which the signal charge from the photodiode 1 has been transferred is represented as a P(A+N) signal. The P(A+N) signal is a signal in which a PA signal based on the signal charge generated by the photodiode 1, which is one of a plurality of photodiodes, is superimposed on the PN signal. In this exemplary embodiment, the P(A+N) signal is a second signal to be output from the analog signal output unit. Further, the transfer pulses PTX1 and PTX2 are set to the H level so that the signal charge accumulated in each of the photodiodes 1 and 51 is transferred to the gate of the amplification MOS transistor 5. Since the reset pulse PRES is kept at the L level during this period, the electric charge supplied from two photodiodes is held in the gate of the amplification MOS transistor 5. A signal to be output to the vertical signal line 7 based on the potential of the gate of the amplification MOS transistor 5 at this time is represented as a P(A+B+N) signal. The P(A+B+N) signal is a signal in which a P(A+B) signal based on the signal charge generated by the plurality of photodiodes 1 and 51 is superimposed on the PN signal. In this exemplary embodiment, the P(A+B+N) signal is a third signal to be output from the analog signal output unit. Further, the first, second, and third signals are analog signals. The foregoing is a description of the pixel 100.

Next, an analog-digital conversion unit 160 of this exemplary embodiment will be described with reference to FIG. 1B.

Figure 1B:
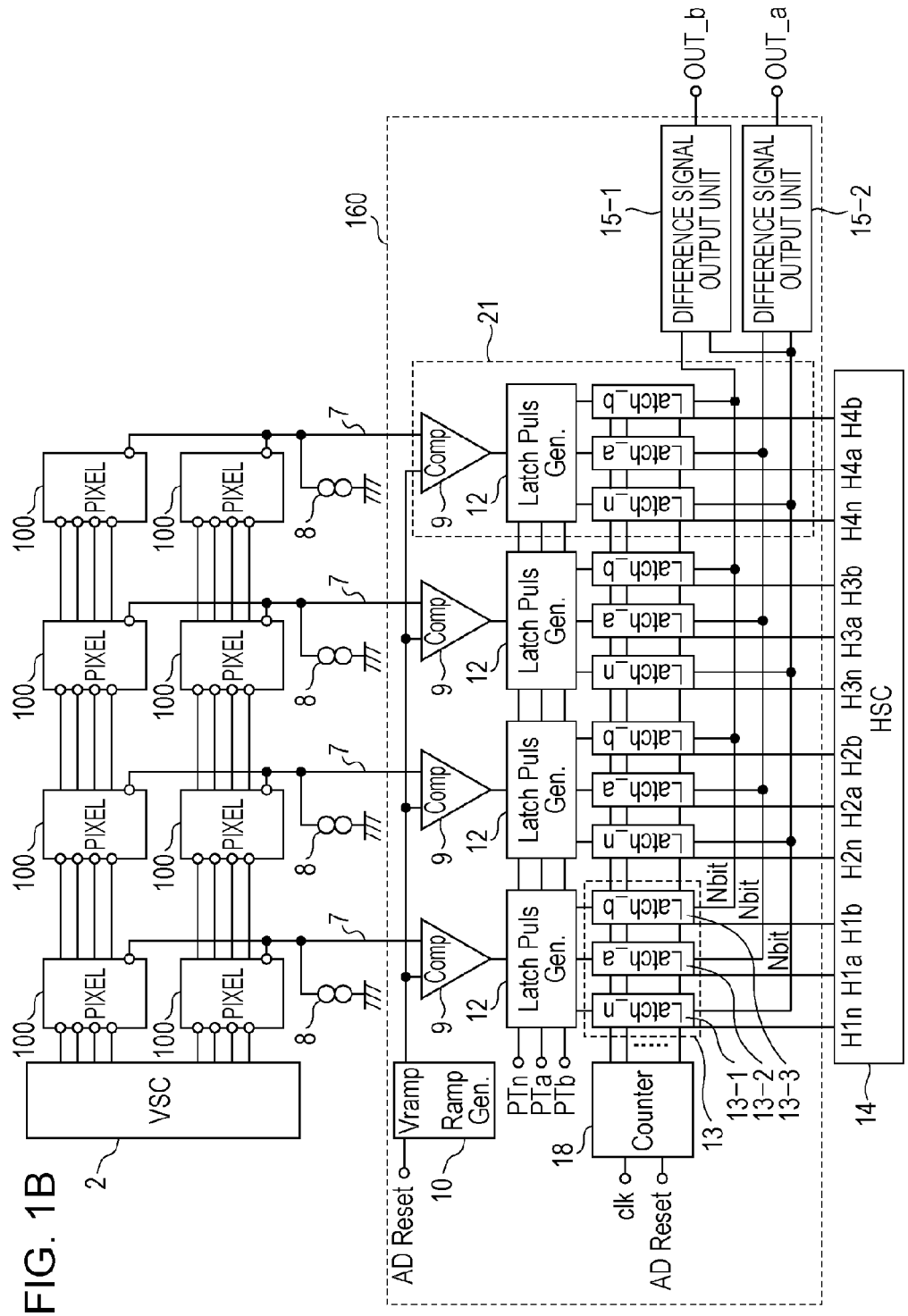
FIG. 1B is a diagram illustrating an example of an equivalent circuit of an imaging device.

Comparators (represented as Comp (Comparator) in FIG. 1B) 9 compare a ramp signal Vramp with signals output from pixels 100 to vertical signal lines 7, and output comparison result signals CMP that are signals based on comparison results to latch selection circuits (represented as Latch Puls Gen. in FIG. 1B) 12. The ramp signal Vramp is a reference signal whose potential changes with time and which is generated by a ramp signal generation circuit (represented as Ramp Gen. (Ramp Generator) in FIG. 1B) 10. The ramp signal generation circuit 10 is supplied with an analog-digital conversion unit reset pulse AD Reset from a timing generator (not illustrated), which is commonly supplied to a first counter 18 described below. The latch selection circuits 12 are provided so as to correspond to columns of a matrix in which a plurality of pixels 100 are arranged. Each of the latch selection circuits 12 outputs the comparison result signal CMP to any of a Latch_n 13-1, a Latch_a 13-2, and a Latch_b 13-3 in accordance with the signal values of latch selection pulses PTn, PTa, and PTb. For example, if the latch selection pulse PTn is at the H level and the other latch selection pulses PTa and PTb are at the L level, the latch selection circuit 12 outputs the comparison result signal CMP to the Latch_n 13-1. Also, if the latch selection pulse PTa is at the H level and the other latch selection pulses PTn and PTb are at the L level, the latch selection circuit 12 outputs the comparison result signal CMP to the Latch_a 13-2. Further, if the latch selection pulse PTb is at the H level and the other latch selection pulses PTn and PTa are at the L level, the latch selection circuit 12 outputs the comparison result signal CMP to the Latch_b 13-3. In the following description, the Latch_n 13-1, the Latch_a 13-2, and the Latch_b 13-3 are collectively referred to as the latch circuits 13. The latch circuits 13 are memory units, and are provided so as to correspond to each column of the matrix in which the plurality of pixels 100 are arranged. The Latch_n 13-1 is a first signal holding unit that holds a digital signal converted from the PN signal, which is a first signal. The Latch_a 13-2 holds a digital signal converted from the P(A+N) signal. The Latch_b 13-3 holds a digital signal converted from the P(A+B+N) signal. The Latch_a 13-2 and the Latch_b 13-3 are second signal holding units that hold digital signals converted from the P(A+N) signal, which is a second signal, and the P(A+B+N) signal, which is a third signal, respectively. The analog-digital conversion unit 160 includes a plurality of circuit units 21. The plurality of circuit units 21 are provided so as to correspond to the respective columns of the pixels. Further, each of the circuit units 21 includes the comparator 9, the latch selection circuit 12, and the latch circuits 13.

A clock pulse signal clk and the analog-digital conversion unit reset pulse AD Reset are output to the first counter (represented as Counter in FIG. 1B) 18 from the timing generator (not illustrated). The first counter 18 generates a count signal obtained by counting pulses of the clock pulse signal clk for a period from the beginning to the end of the change in the potential of the ramp signal Vramp of the ramp signal generation circuit 10 with time. Each of the latch circuits 13, namely, the Latch_n 13-1, the Latch_a 13-2, and the Latch_b 13-3, holds a count signal obtained when the comparison result signal CMP output from the comparator 9 changes. A horizontal scanning circuit (represented as HSC (Horizontal Scanning Circuit) in FIG. 1B) 14 sequentially selects the latch circuits 13 for the respective columns, and causes the latch circuits 13 for the respective columns to output the count signals held therein. A digital N signal and a digital A+B+N signal which are output under control of the horizontal scanning circuit 14 are output to a difference signal output unit 15-1. The difference signal output unit 15-1 outputs, as an OUT_b output, a digital A+B signal that is a difference signal between the digital A+B+N signal and the digital N signal. The digital N signal and the digital A+N signal are output to a difference signal output unit 15-2. The difference signal output unit 15-2 outputs, as an OUT_a output, a digital A signal that is a difference signal between the digital A+N signal and the digital N signal. The digital A+B signal and the digital A signal are signals that the imaging device in this exemplary embodiment outputs.

Next, the operation of the imaging device illustrated by way of example in FIGS. 1A and 1B will be described with reference to FIG. 2.

At time t11, the selection pulse PSEL and the analog-digital conversion unit reset pulse AD Reset are at the H level. The analog-digital conversion unit reset pulse AD Reset is supplied to each of the ramp signal generation circuit 10 and the first counter 18 illustrated in FIG. 1B. When the analog-digital conversion unit reset pulse AD Reset is at the H level, the potential of the ramp signal Vramp has the reset level, and the count signal of the first counter 18 is reset to the initial value. At the time t11, furthermore, the reset pulse PRES is changed from the H level to the L level. The signal output from the pixel 100 to the vertical signal line 7 after the reset is released at the time t11 is a PN signal.

At time t12, the analog-digital conversion unit reset pulse AD Reset is changed from the H level to the L level. Then, the ramp signal Vramp begins to change its potential with time. Further, the first counter 18 starts to count pulses of the clock pulse signal clk, and outputs a count signal to the latch circuits 13 for the respective columns. Further, the latch selection pulse PTn is set to the H level.

For example, it is assumed that the magnitude relationship between the ramp signal Vramp and the potential Vline of the vertical signal line 7 is inverted at time t13. In this case, the comparator 9 outputs the comparison result signal CMP to the latch selection circuit 12. Since the latch selection pulse PTn is at the H level, the comparison result signal CMP is output to the Latch_n 13-1. The Latch_n 13-1 holds the count signal obtained when the comparison result signal CMP is output. At this time, the count signal value is "4", and thus a count signal of "4" is held in the Latch_n 13-1. The count signal of "4" held in the Latch_n 13-1 is a digital N signal. In this exemplary embodiment, for convenience of description, count signal values are represented in decimal form. Actually, the count signal to be held in the Latch_n 13-1 is a value obtained by converting the decimal number "4" into binary. Also in the following description, count signal values will be represented herein in decimal form.

At time t14, the analog-digital conversion unit reset pulse AD Reset is changed from the L level to the H level, and the change in the potential of the ramp signal Vramp with time ends. Further, the latch selection pulse PTn is changed from the H level to the L level.

At time t15, the transfer pulse PTX1 is changed from the L level to the H level. Thus, the electric charge accumulated in the photodiode 51 is transferred to the gate of the amplification MOS transistor 5, and the P(A+N) signal is output to the vertical signal line 7 from the pixel 100.

At time t16, the analog-digital conversion unit reset pulse AD Reset is changed from the H level to the L level. Then, the ramp signal Vramp begins to change its potential with time. Further, the first counter 18 starts to count pulses of the clock pulse signal clk, and outputs a count signal to the latch circuits 13 for the respective columns. Further, the latch selection pulse PTa is set to the H level.

For example, it is assumed that the magnitude relationship between the ramp signal Vramp and the potential Vline of the vertical signal line 7 is inverted at time t17. In this case, the comparator 9 outputs the comparison result signal CMP to the latch selection circuit 12. Since the latch selection pulse PTa is at the H level, the comparison result signal CMP is output to the Latch_a 13-2. The Latch_a 13-2 holds the count signal obtained when the comparison result signal CMP is output. Since the count signal value at this time is "6", a count signal of "6" is held in the Latch_a 13-2. The count signal of "6" held in the Latch_a 13-2 is a digital A+N signal.

At time t18, the analog-digital conversion unit reset pulse AD Reset is changed from the L level to the H level, and the change in the potential of the ramp signal Vramp with time ends. Further, the latch selection pulse PTa is changed from the H level to the L level. Further, the horizontal scanning circuit 14 causes the Latch_n 13-1 and the Latch_a 13-2 to respectively output the count signals held therein to the difference signal output unit 15-2. The difference signal output unit 15-2 performs differential processing between the count signal of "6" held in the Latch_a 13-2 and the count signal of "4" held in the Latch_n 13-1, and outputs a count signal of "2" as an OUT_a output. The count signal of "2" is a digital A signal.

At time t19, the transfer pulse PTX2 is changed from the L level to the H level. Thus, the electric charge accumulated in the photodiode 1 is transferred to the gate of the amplification MOS transistor 5, and the P(A+B+N) signal is output to the vertical signal line 7 from the pixel 100.

At time t20, the analog-digital conversion unit reset pulse AD Reset is changed from the H level to the L level. Then, the ramp signal Vramp begins to change its potential with time. Further, the first counter 18 starts to count pulses of the clock pulse signal clk, and outputs a count signal to the latch circuits 13 for the respective columns. Further, the latch selection pulse PTb is set to the H level.

For example, it is assumed that the magnitude relationship between the ramp signal Vramp and the potential Vline of the vertical signal line 7 is inverted at time t21. In this case, the comparator 9 outputs the comparison result signal CMP to the latch selection circuit 12. Since the latch selection pulse PTb is at the H level, the comparison result signal CMP is output to the Latch_b 13-3. The Latch_b 13-3 holds the count signal obtained when the comparison result signal CMP is output. Since the count signal value at this time is "8", a count signal of "8" is held in the Latch_b 13-3. The count signal of "8" held in the Latch_b 13-3 is a digital A+B+N signal.

At time t22, the analog-digital conversion unit reset pulse AD Reset is changed from the L level to the H level, and the change in the potential of the ramp signal Vramp with time ends. Further, the latch selection pulse PTb is changed from the H level to the L level. Further, the horizontal scanning circuit 14 causes the Latch_n 13-1 and Latch_b 13-3 to respectively output the count signals held therein to the difference signal output unit 15-1. The difference signal output unit 15-1 performs differential processing between the count signal of "8" held in the Latch_b 13-3 and the count signal of "4" held in the Latch_n 13-1, and outputs a count signal of "4" as an OUT_b output. The count signal of "4" is a digital A+B signal.

Through the operation described above, the imaging device of this exemplary embodiment can output a digital A signal and a digital A+B signal. In the imaging device of this exemplary embodiment, the digital N signal, the digital A+N signal, and the digital A+B+N signal are held in the respective latch circuits 13. Thus, unlike PTL 1, variations in capacitance of capacitors, which are due to the holding of one signal in a plurality of different capacitors, do not occur. Therefore, the imaging device of this exemplary embodiment can accurately obtain a digital A signal and a digital A+B signal. The digital N signal of this exemplary embodiment contains, in addition to the noise component of the pixels 100, the operation variation component for each comparator in the plurality of comparators 9. The imaging device of this exemplary embodiment subtracts the digital N signal from the digital A+N signal and the digital A+B+N signal, and outputs the resulting signal. Therefore, the noise component of the pixels 100 and the operation variation component for each comparator in the plurality of comparators 9, which are contained in the digital A+N signal and the digital A+B+N signal, can be removed, and a reduction in image quality can be reduced.

The difference signal output unit 15-2 outputs a digital A signal. The digital A signal is a first difference signal between the digital A+N signal converted from the second signal and the digital N signal converted from the first signal. The difference signal output unit 15-1 outputs the digital A+B signal. The digital A+B signal is a second difference signal between the digital A+B+N signal converted from the third signal and the digital N signal converted from the first signal.

Further, in order to obtain a P(A+B) signal that is a difference signal obtained by subtracting a PN signal from a P(A+B+N) signal by using the imaging device described in PTL 1, it may be considered that the N signal is held in the capacitor 23-2 in addition to the capacitor 23-1. In this form, however, a plurality of capacitors need to hold the N signal, and there has been a problem in that, due to variations in capacitance of the plurality of capacitors, the A signal and the A+B signal may not accurately be obtained. Accordingly, in PTL 1, even if the same PN signal is output from one pixel 100, due to variations in capacitance of a plurality of capacitors that hold the PN signal, the signal values of the PN signal may vary. In contrast, in the imaging device of this exemplary embodiment, the PN signal is held in the latch circuit Latch_n 13-1 as a digital N signal. Thus, variations in PN signal due to being held in different capacitors can be reduced.

In this exemplary embodiment, an imaging device including pixels 100 each having two photodiodes 1 and 51 has been described. This exemplary embodiment is not limited to this form. This exemplary embodiment may also be implemented, as desired, with an imaging device including pixels 100 each having a single photodiode. That is, in the configuration of the pixel 100 illustrated by way of example in FIG. 1A, the photodiode 51 and the transfer MOS transistor 50 may be omitted. In this case, the transfer pulse PTX2 may be set to the H level at time t15 and time t19. First, the transfer pulse PTX2 is set to the H level at time t15 so that the signal charge generated by the photodiode 1 is transferred to the gate of the amplification MOS transistor 5. The signal output here is a second signal. After that, the transfer pulse PTX2 is set to the L level. Then, the photodiode 1 performs photoelectric conversion based on incident light again to generate signal charge. At time t19, the transfer pulse PTX2 is set to the H level again. Thus, the signal charge accumulated in the photodiode 1 is transferred to the gate of the amplification MOS transistor 5. Since the reset pulse PRES is kept at the L level during this period, the signal charge transferred from the photodiode 1 at the time t15 and the signal charge transferred at the time t19 are held in the gate of the amplification MOS transistor 5. The signal output from the pixel 100 at this time is a third signal. In this form, for example, the second signal and the third signal may be signals based on signal charge generated by changing the exposure duration of the photodiode 1.

Further, even a form where the pixel 100 has a plurality of photodiodes may be made different from the form described in this exemplary embodiment. That is, in a form, the pixel 100 may output a first signal that is output to the vertical signal line 7 by setting the potential of the gate of the amplification MOS transistor 5 to the reset level, a second signal that is based on signal charge generated by m (m is a natural number) photodiodes among the plurality of photodiodes included in the pixel 100, and a third signal that is based on signal charge generated by n (n is a natural number) photodiodes, where n is greater than m.

This exemplary embodiment provides a form in which the Latch_n 13-1 holds one digital N signal. In another form, a double buffer memory having a plurality of memories capable of holding digital N signals may be used. That is, a first memory included in the Latch_n 13-1 holds digital N signals converted from the PN signals of the pixels in the first row of this exemplary embodiment at the time t14. Then, the digital N signals are transferred from the first memory to a second memory during any period from the time t14 to the time t18. The horizontal scanning circuit 14 causes the digital N signals to be output from the second memory to the difference signal output unit 15-2. Meanwhile, after the digital N signals are transferred to the second memory, the selection pulse PSEL is set to the L level at the time t22, and the selection pulse PSEL and the reset pulse PRES for the pixels 100 in the subsequent row are set to the H level. After that, the analog-digital conversion unit reset pulse AD Reset is changed from the H level to the L level, and the operation of generating digital signals converted from the PN signals for the pixels 100 in the subsequent row is performed. Thus, at the time t22, the Latch_n 13-1 can perform, in parallel, the output of the digital N signals to the difference signal output unit 15-1 and the generation of the digital N signals converted from the PN signals for the pixels 100 in the subsequent row. This can reduce the time required to generate and output digital signals converted from the signals output from pixels 100 in a plurality of rows.

Furthermore, this exemplary embodiment has been described on the basis of a form in which the horizontal scanning circuit 14 causes a digital A+N signal and a digital A+B+N signal to be output from the Latch_a 13-2 and the Latch_b 13-3, respectively. In another form, a digital signal may be transferred from the Latch_a 13-2 to the Latch_b 13-2 and the horizontal scanning circuit 14 may cause the digital signal to be output from the Latch_b 13-2. Specifically, at the time t18, the Latch_a 13-2 transfers the digital A+N signal held therein to the Latch_b 13-3. The horizontal scanning circuit 14 causes the digital A+N signal to be output from the Latch_b 13-3. Further, the Latch_a 13-2 holds a digital A+B+N signal converted from the P(A+B+N) signal, which is obtained by counting pulses of the clock pulse signal clk, for a period from the time t20 to the time t22. At the time t22, the Latch_a 13-2 transfers the digital A+B+N signal held therein to the Latch_b 13-3. The horizontal scanning circuit 14 transfers the digital A+B+N signal from the Latch_b 13-3 to a difference signal output unit 15. Therefore, the plurality of difference signal output units 15-1 and 15-2, which are provided in this exemplary embodiment, can be replaced by one difference signal output unit 15.

Further, the analog-digital conversion unit of this exemplary embodiment is of a type that performs AD conversion on the basis of the comparison between a ramp signal whose potential changes with time and a pixel signal. Any other AD conversion type, for example, successive-approximation AD conversion or delta-sigma AD conversion, may be performed.

Exemplary Embodiment 2

An imaging device of this exemplary embodiment will be described focusing on a portion different from Exemplary Embodiment 1.

The following description will be made with reference to the drawings.

Figure 3A:
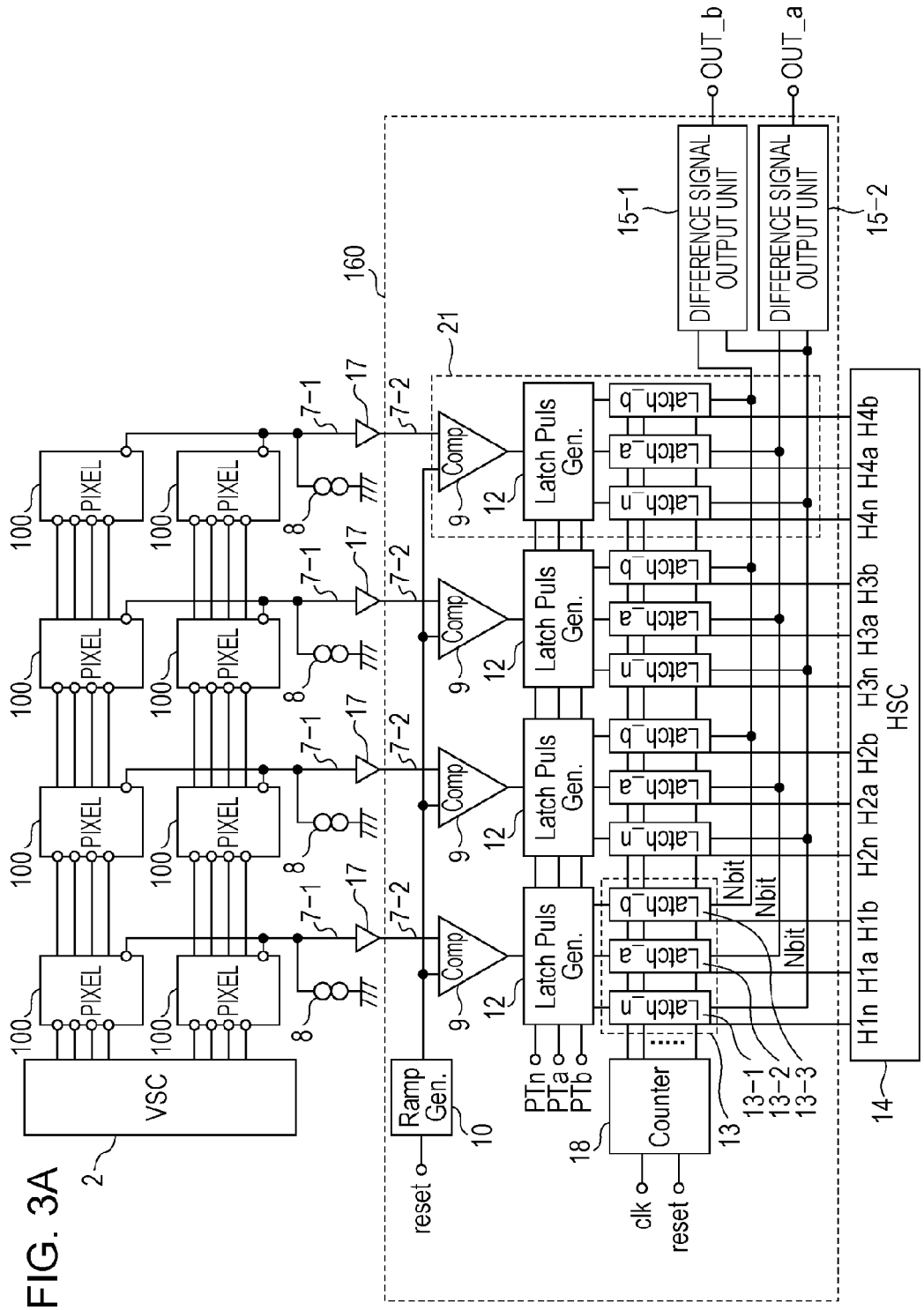
FIG. 3A is a diagram illustrating an example of an equivalent circuit of an imaging device in another form.

FIG. 3A is an equivalent circuit diagram illustrating an example of the imaging device of this exemplary embodiment. Portions having the same functions as those in FIG. 1B described above in Exemplary Embodiment 1 are assigned the same numerals as those assigned in FIG. 1B.

The difference from Exemplary Embodiment 1 is that each of a PN signal, a P(A+N) signal, and a P(A+B+N) signal output from each of the pixels 100 is inverted and amplified by an inverting amplifier 17 and is output to the comparator 9. The inverting amplifier 17 is an amplification unit that amplifies a pixel signal and outputs the amplified signal to the comparator 9. A plurality of inverting amplifiers 17 are provided so as to correspond to columns of the plurality of pixels 100 arranged in a matrix. Each of the vertical signal lines 7 is separately identified as a vertical signal line 7-1 representing an electrical path extending from the pixels 100 to the inverting amplifier 17 and a vertical signal line 7-2 representing an electrical path extending from the inverting amplifier 17 to the comparator 9. An analog signal output unit of this exemplary embodiment includes the pixels 100 and the inverting amplifiers 17. In this exemplary embodiment, signals output from the inverting amplifiers 17 on the basis of PN signals output from the pixels 100 are supplied to the comparators 9. The signals output from the inverting amplifiers 17 on the basis of the PN signals output from the pixels 100 are represented as GN signals. Similarly, the signals output from the inverting amplifiers 17 on the basis of the P(A+N) signals output from the pixels 100 are represented as G(A+N) signals, and the signals output from the inverting amplifiers 17 on the basis of the P(A+B+N) signals are represented as G(A+B+N) signals. In this exemplary embodiment, a first signal output from the analog signal output unit is a GN signal. Further, a second signal output from the analog signal output unit is a G(A+N) signal. Further, a third signal output from the analog signal output unit is a G(A+B+N) signal.

FIG. 3B is a timing chart illustrating an example of the operation of the imaging device illustrated by way of example in FIG. 3A. In FIG. 2, as described above in Exemplary Embodiment 1, the potential corresponding to the vertical signal line 7-1 of this exemplary embodiment is represented as the potential Vline of the vertical signal line 7. In contrast, FIG. 3B of this exemplary embodiment illustrates a potential Vline2 of the vertical signal line 7-2, which is an electrical path extending from the inverting amplifier 17 to the comparator 9.

The potential Vline2 of the vertical signal line 7-2 is a signal obtained by inverting and amplifying the potential of the vertical signal line 7-1, and therefore has an electrical polarity opposite to that of the vertical signal line 7-1. Accordingly, in this exemplary embodiment, the direction in which the potential Vline2 of the vertical signal line 7-2 changes in response to a P(A+N) signal and a P(A+B+N) signal output from the pixel 100 is opposite to that in Exemplary Embodiment 1. Thus, the direction of the change in potential of the ramp signal Vramp with time is also opposite to that in Exemplary Embodiment 1.

The digital N signal held in the Latch_n 13-1 is a signal obtained by converting the GN signal into a digital signal. The digital N signal of this exemplary embodiment is a signal including the noise component of the analog signal output unit including the pixels 100 and the inverting amplifiers 17, and the operation variation component for each comparator in the plurality of comparators 9.

Further, the digital A+N signal held in the Latch_a 13-2 is a signal obtained by converting the G(A+N) signal output from the pixel 100 into a digital signal.

Further, the digital A+B+N signal held in the Latch_b 13-3 is a signal obtained by converting the G(A+B+N) signal into a digital signal.

Other points may be similar to those in the imaging device of Exemplary Embodiment 1. That is, the operation at each of times t31 to t42 may be similar to the operation at each of times t11 to t22 of Exemplary Embodiment 1.

The digital N signal of this exemplary embodiment includes, in addition to the noise component of the analog signal output unit including the pixels 100 and the inverting amplifiers 17, the operation variation component for each comparator in the plurality of comparators 9. The imaging device of this exemplary embodiment subtracts the digital N signal from the digital A+N signal and the digital A+B+N signal, and outputs the resulting signal. Thus, the noise component of the analog signal output unit including the pixels 100 and the inverting amplifiers 17 and the operation variation component for each comparator in the plurality of comparators 9, which are contained in the digital A+N signal and the digital A+B+N signal, can be removed, and a reduction in image quality can be reduced.

The imaging device of this exemplary embodiment can also achieve advantages similar to those in Exemplary Embodiment 1. The inverting amplifiers 17 may be replaced by non-inverting amplifiers or buffer circuits. In this case, the direction in which the potential Vline2 and the ramp signal Vramp change matches that of the potential Vline and the ramp signal Vramp illustrated in FIG. 2.

Exemplary Embodiment 3

An imaging device of this exemplary embodiment will be described focusing on a portion different from Exemplary Embodiment 2.

The following description will be made with reference to the drawings.

Figure 4A:
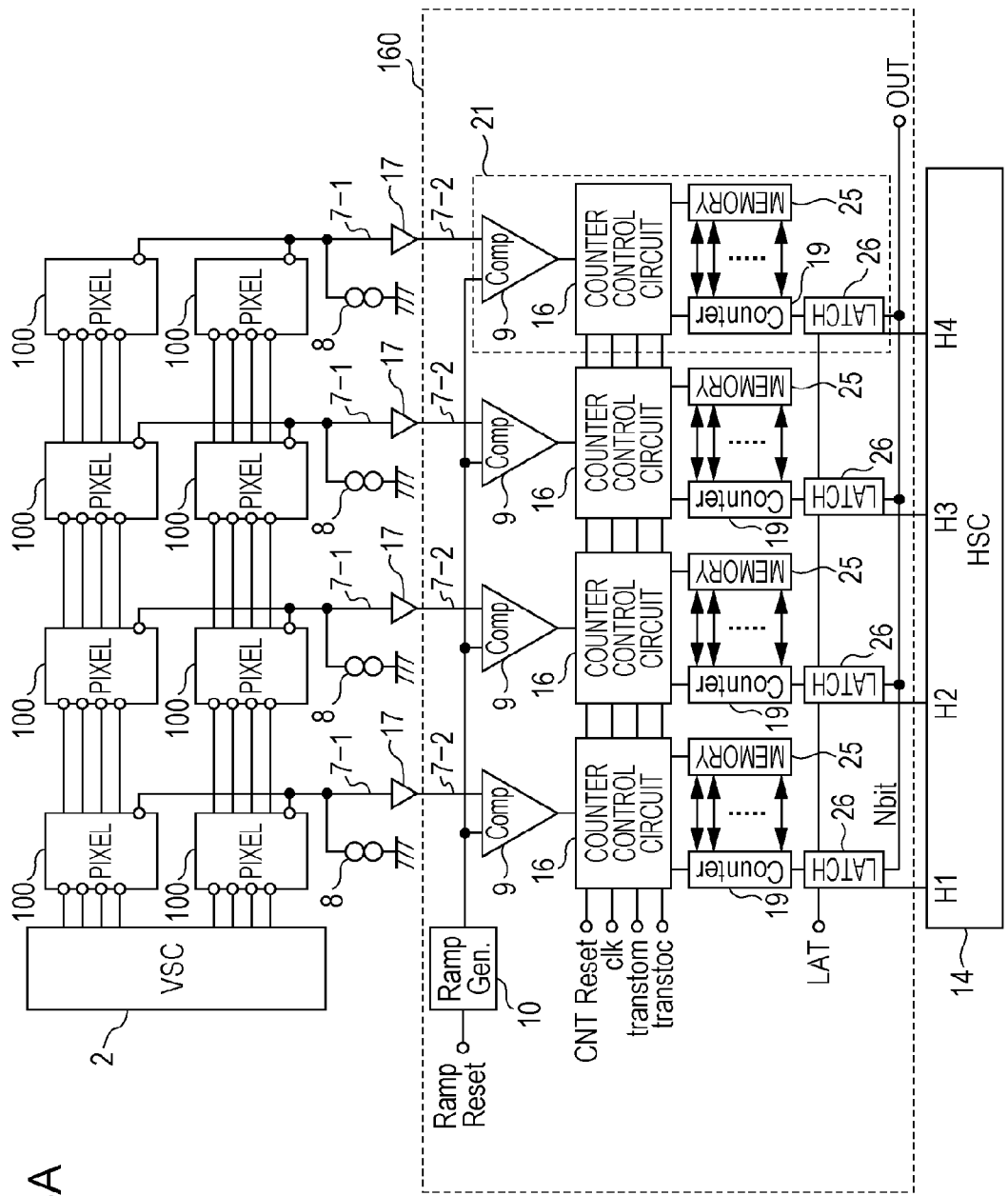
FIG. 4A is a diagram illustrating an example of an equivalent circuit of an imaging device in another form.

FIG. 4A is an equivalent circuit diagram illustrating an example of the imaging device of this exemplary embodiment. The imaging device of this exemplary embodiment is not provided with the latch selection circuits 12 but is provided with counter control circuits 16 so as to correspond to the respective columns of pixels. Further, in Exemplary Embodiments 1 and 2, the first counter 18 supplies a common count signal to the latch circuits 13 for the respective columns. In this exemplary embodiment, however, a second counter 19 is provided so as to correspond to the counter control circuit 16 for each column. Memories 25 that hold signals of the second counters 19 are provided so as to correspond to the second counters 19 for the respective columns. The memories 25 that hold the signals of the second counters 19 are first signal holding units that hold digital N' signals generated based on the GN signals output from the inverting amplifiers 17. Further, in the comparison between a third signal and the ramp signal Vramp, the memories 25 output the digital N' signals to the second counters 19. A clock pulse signal clk is input to the counter control circuits 16 from a timing generator (not illustrated). Further, the counter control circuits 16 activate the second counters 19 and the memories 25 on the basis of a count signal reset pulse CNT Reset, a pulse "transtom", and a pulse "transtoc". Latches 26 hold the count signals of the second counters 19. In Exemplary Embodiment 2, two latches, namely, the Latch_a 13-1 and the Latch_b 13-2, are included as second signal holding units that hold a digital signal converted from the second signal and a digital signal converted from the third signal. In contrast, in this exemplary embodiment, only one latch, namely, the latches 26, may be used. The latches 26 are second signal holding units that hold a digital signal converted from the second signal and a digital signal converted from the third signal of this exemplary embodiment. A latch signal LAT is supplied to the latches 26 for the respective columns. When the latch signal LAT is at the H level, the latches 26 capture count signal values output from the second counters 19. A ramp signal reset pulse Ramp Reset for resetting the potential of a ramp signal to the initial value is supplied to the ramp signal generation circuit 10.

Figure 4B:
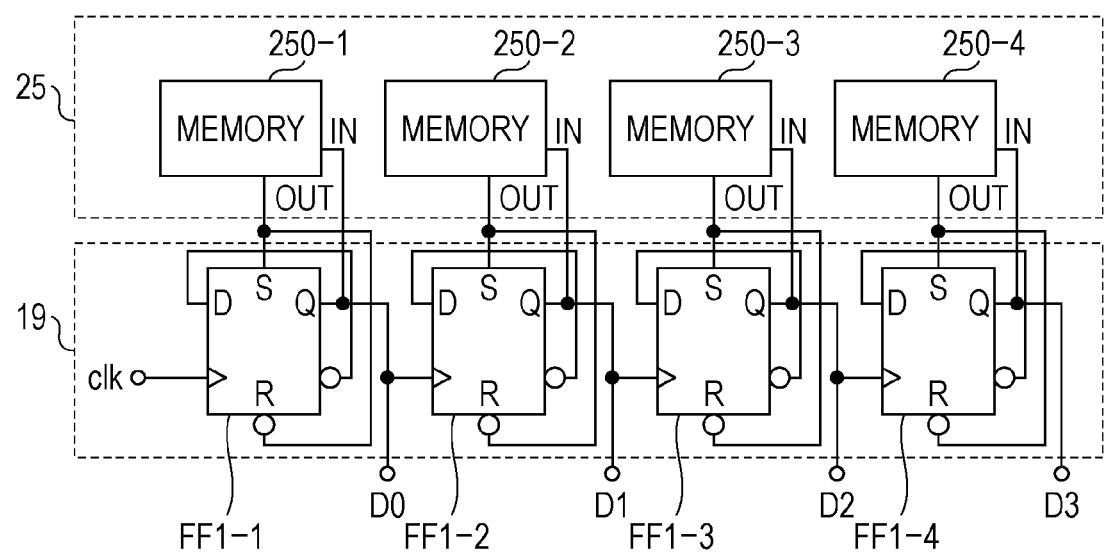
FIG. 4B is a diagram illustrating an example of an equivalent circuit of a counter in the other form.

FIG. 4B is an equivalent circuit diagram illustrating, by way of example, a second counter 19 and a memory 25 in the imaging device illustrated by way of example in FIG. 4A. The second counter 19 has a plurality of flip-flop circuits FF1-1 to FF1-4 that generate count signals. That is, the second counter 19 has a plurality of flip-flop circuits FF1-1 to FF1-4 that generate count signals including a plurality of bit signals. A bit signal is a signal of each bit of a count signal. The memory 25, which is a first signal holding unit, has a plurality of bit memories 250-1 to 250-4, and each of the plurality of bit memories 250-1 to 250-4 is electrically connected to one of the plurality of flip-flop circuits FF1-1 to FF1-4. That is, the memory 25 has a plurality of bit memories 250-1 to 250-4 that hold individual bit signals, and each of the plurality of bit memories is electrically connected to the corresponding one of the plurality of flip-flop circuits FF1-1 to FF1-4. The second counter 19 of this exemplary embodiment is configured such that the plurality of flip-flop circuits FF1-1 to FF1-4 are electrically connected in such a manner that the output of the non-inverting output terminal Q of the preceding stage is connected to the input of the clock terminal of the subsequent stage. Further, the outputs D0 to D3 of the non-inverting output terminals Q of the flip-flop circuits FF1-1 to FF1-4 are connected to the input of the latches 26 and are also supplied to the bit memories 250-1 to 250-4, respectively.

Further, as a feature of this exemplary embodiment, each of the flip-flop circuits FF1-1 to FF1-4 has an inverting output terminal NQ whose output is supplied to a terminal D thereof, and the outputs of the respective non-inverting output terminals Q are also supplied to the bit memories 250-1 to 250-4. Further, the signals held in the bit memories 250-1 to 250-4 are output to S terminals of the respective flip-flop circuits.

Figure 5:
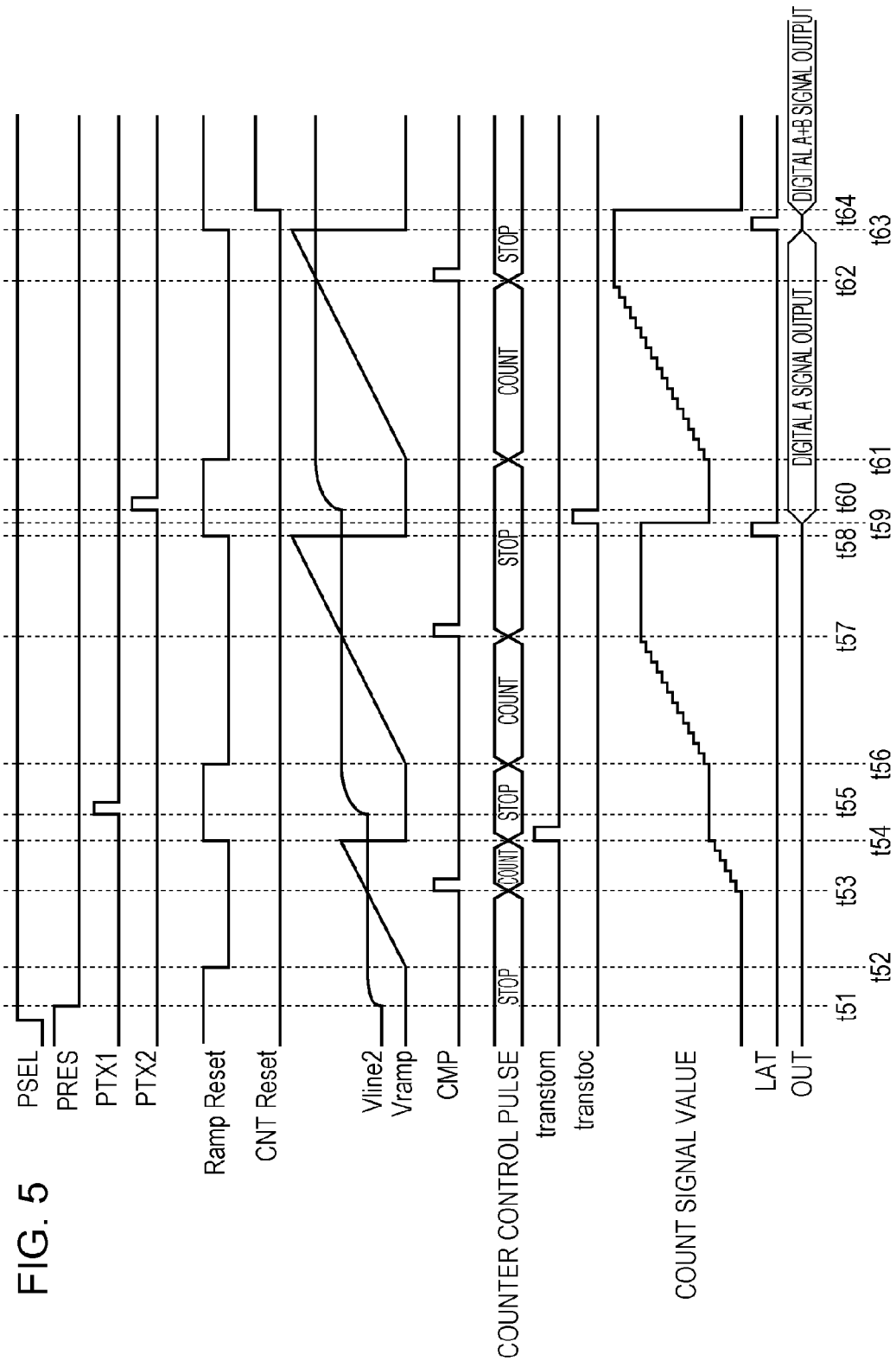
FIG. 5 is a diagram illustrating an example of the operation of the imaging device in the other form.

FIG. 5 is a timing chart illustrating an example of the operation of the imaging device described above with reference to FIGS. 4A and 4B. A counter control pulse is a signal output from the counter control circuit 16 to the second counter 19, and the second counter 19 operates on the basis of the counter control pulse.

At time t51, the selection pulse PSEL and the ramp signal reset pulse Ramp Reset are at the H level. Further, at time t51, the reset pulse PRES is changed from the H level to the L level. Further, the counter control pulse is in a "stop" state where the second counter 19 does not operate.

At time t52, the ramp signal reset pulse Ramp Reset is changed from the H level to the L level. Then, the change in the potential of the ramp signal Vramp with time begins.

For example, it is assumed that the magnitude relationship between the potential Vline2 of the vertical signal line 7-2 and the potential of the ramp signal Vramp is inverted at time t53. In this case, the comparator 9 outputs the comparison result signal CMP to the counter control circuit 16. The counter control circuit 16 receives the comparison result signal CMP, and changes the counter control pulse from the "stop" state to a "count" state. Thus, the second counter 19 starts its counting operation at the time t53.

At time t54, the change in the potential of the ramp signal Vramp with time ends, and the ramp signal reset pulse Ramp Reset is changed from the L level to the H level. Further, the counter control pulse is changed from the "count" state to the "stop" state. Thus, the second counter 19 temporarily stops its counting operation at the time t54. Further, the pulse "transtom" is set to the H level. Thus, a count signal value obtained by counting from the time t53 to the time t54 is held in the memory 25. The signal held in the memory 25 at this point of time is a digital N' signal. Then, the pulse "transtom" is set to the L level.

At time t55, the transfer pulse PTX1 is changed from the L level to the H level. Thus, the electric charge accumulated in the photodiode 51 is transferred to the gate of the amplification MOS transistor 5, and the P(A+N) signal is output to the vertical signal line 7 from the pixel 100. The G(A+N) signal is output from the inverting amplifier 17 to the comparator 9.

At time t56, the ramp signal reset pulse Ramp Reset is changed from the H level to the L level. Then, the change in the potential of the ramp signal Vramp with time begins. Further, the counter control pulse is changed from the "stop" state to the "count" state. Thus, the second counter 19 starts its counting operation from the count signal value obtained at the time t54.

For example, it is assumed that magnitude relationship between the potential Vline2 of the vertical signal line 7-2 and the potential of the ramp signal Vramp is inverted at time t57. In this case, the comparator 9 outputs the comparison result signal CMP to the counter control circuit 16. The counter control circuit 16 receives the comparison result signal CMP, and changes the counter control pulse from the "count" state to the "stop" state. Thus, the second counter 19 holds a count signal obtained by further counting from the time t56 to the time t57, starting from the count signal value obtained at the time t54.

At time t58, the ramp signal reset pulse Ramp Reset is changed from the L level to the H level, and the change in the potential of the ramp signal Vramp with time ends. Further, the latch signal LAT is set to the H level. Thus, at the time t58, the count signal held in the second counter 19 is captured in the latch 26.

The digital signal held at this point of time will now be described. The operation from the time t52 to the time t54 is hereinafter referred to as N conversion. In the N conversion of this exemplary embodiment, the digital N' signal, which is a count signal value obtained by counting from the time t53 when the comparator 9 outputs the comparison result signal CMP to the time t54, is held in the second counter 19. This count signal value is a count signal value (Nmax−Ncnt) obtained by subtracting a count signal value Ncnt obtained by counting from the time t52 to the time t53 from a maximum count signal value Nmax during the N conversion (that is, a count signal value obtained by counting throughout the period from the time t52 when the ramp signal Vramp begins to change its potential with time to the time t54). While in Exemplary Embodiment 2, the Latch_n 13-1 holds the count signal value Ncnt, in this exemplary embodiment, the latch 26 holds the count signal value (Nmax−Ncnt).

Next, the operation during the period from the time t56 to the time t58 (hereinafter referred to as A+N conversion) will be described. At the time t56, the second counter 19 holds the count signal value (Nmax−Ncnt). Thus, the second counter 19 starts its counting operation during the period from the time t56 to the time t57, starting from the count signal value (Nmax−Ncnt). The count signal value held in the second counter 19 at the time t58 is a value obtained by adding the count signal value (Nmax−Ncnt) to a count signal value Acnt+Ncnt obtained by the counting operation during the period from the time t56 to the time t57, starting from the initial count signal value (that is, the count signal value obtained at the time t52). The count signal value obtained at the time t58 is represented by Acnt+Ncnt+(Nmax−Ncnt), that is, Acnt+Nmax. Accordingly, a digital signal that does not contain the component of the GN signal and in which an offset of Nmax is added to the digital A signal is held in the latch 26. The digital signal having the count signal value of Acnt+Nmax is a digital signal converted from the GA signal to be output based on the PA signal.

Therefore, in order to obtain the digital A signal, the known maximum count signal value Nmax obtained during the N conversion is subtracted from the count signal value Acnt+Nmax held in the second counter 19 at the time t58. Thus, the count signal value Acnt, that is, the digital A signal, can be obtained.

After the latch signal LAT is set to the H level at the time t58, the latch signal LAT is set to the L level.

At time t59, the pulse "transtoc" is set to the H level, and the count signal value of the second counter 19 is returned to the count signal value obtained at the time t54. That is, the count signal value is set to the signal value of the digital N' signal. Further, the horizontal scanning circuit 14 sequentially selects the latches 26 for the respective columns, and outputs the digital A signals held in the latches 26.

At time t60, the transfer pulse PTX2 is changed from the L level to the H level. Thus, the electric charge accumulated in the photodiode 1 is transferred to the gate of the amplification MOS transistor 5, and the P(A+B+N) signal is output to the vertical signal line 7 from the pixel 100. The G(A+B+N) signal is output from the inverting amplifier 17 to the comparator 9.

At time t61, the ramp signal reset pulse Ramp Reset is changed from the H level to the L level. Then, the change in the potential of the ramp signal Vramp with time begins. Further, the counter control pulse is changed from the "stop" state to the "count" state. Thus, the second counter 19 starts its counting operation from the count signal value (which is also the count signal value obtained at the time t59) obtained at the time t54.

For example, it is assumed that the magnitude relationship between the potential Vline2 of the vertical signal line 7-2 and the potential of the ramp signal Vramp is inverted at time t62. In this case, the comparator 9 outputs the comparison result signal CMP to the counter control circuit 16. The counter control circuit 16 receives the comparison result signal CMP, and changes the counter control pulse from the "count" state to the "stop" state. Thus, the second counter 19 holds a count signal obtained by further counting during the period from the time t61 to the time t62, starting from the count signal value obtained at the time t54.

At time t63, the change in the potential of the ramp signal Vramp with time ends, and the ramp signal reset pulse Ramp Reset is changed from the L level to the H level. Further, the latch signal LAT is set to the H level. Thus, the count signal held in the second counter 19 at the time t63 is captured in the latch 26.

The digital signal captured in the latch 26 at this point of time will be described. The operation from the time t61 to the time t63 (hereinafter referred to as A+B+N conversion) will be described. At the time t61, the second counter 19 holds a count signal value (Nmax−Ncnt). Thus, the second counter 19 starts its counting operation during the period from the time t61 to the time t62, starting from the count signal value (Nmax−Ncnt). The count signal value held in the second counter 19 at the time t62 is a value obtained by adding the count signal value (Nmax−Ncnt) to the count signal value Acnt+Bcnt+Ncnt obtained by the counting operation during the period from the time t61 to the time t62, starting from the initial count signal value (that is, the count signal value obtained at the time t52). The count signal value at the time t58 is represented by Acnt+Bcnt+Ncnt+(Nmax−Ncnt), that is, Acnt+Bcnt+Nmax. Accordingly, a digital signal that does not contain the component of the GN signal and in which an offset of Nmax is added to the digital A+B signal is held in the latch 26. The digital signal having the count signal value of Acnt+Bcnt+Nmax is a digital signal converted from the G(A+B) signal to be output based on the P(A+B) signal.

Therefore, in order to obtain the digital A+B signal, the known maximum count signal value Nmax obtained during the N conversion is subtracted from the count signal value Acnt+Bcnt+Nmax held in the second counter 19 at the time t63. Thus, the count signal value Acnt+Bcnt, that is, the digital A+B signal, can be obtained.

After the latch signal LAT is set to the H level at the time t63, the latch signal LAT is set to the L level.

At time t64, the count signal reset pulse CNT Reset is set to the H level. Thus, the signal value of the count signal of the second counter 19 is reset to the initial value. Further, the horizontal scanning circuit 14 sequentially selects the latches 26 for the respective columns, and outputs the digital signals held in the latches 26 at the time t63.

The process for subtracting Nmax from the digital signal held in the latch 26, which is performed in order to obtain the digital A signal and the digital A+B signal, may be performed in the imaging device or by a signal processing unit (not illustrated) electrically connected to the imaging device.

The circuit unit 21 of this exemplary embodiment located for each column includes a comparator 9, a counter control circuit 16, a second counter 19, a memory 25, and a latch 26. The circuit unit 21 for each column outputs a digital A signal. The digital A signal is a first difference signal between the digital A+N signal converted from the second signal and the digital N signal converted from the first signal. The circuit unit 21 for each column further outputs a digital A+B signal. The digital A+B signal is a second difference signal between the digital A+B+N signal converted from the third signal and the digital N signal converted from the first signal.

As described above, the imaging device of this exemplary embodiment can also acquire a digital A signal and a digital A+B signal. Further, the digital signal held in the latch 26 can be a signal that does not contain the component of the GN signal converted from the PN signal. That is, the operation of this exemplary embodiment allows the operation of comparing the pixel signal with the ramp signal Vramp and the operation of obtaining a digital signal converted from a signal obtained by subtracting the N signal from the A+N signal and the A+B+N signal to be performed in parallel.

The imaging device of this exemplary embodiment can also achieve advantages similar to those in Exemplary Embodiments 1 and 2.

Exemplary Embodiment 4

An imaging device of this exemplary embodiment will be described focusing on a portion different from Exemplary Embodiment 3.

The following description will be made with reference to the drawings.

Figure 6A:
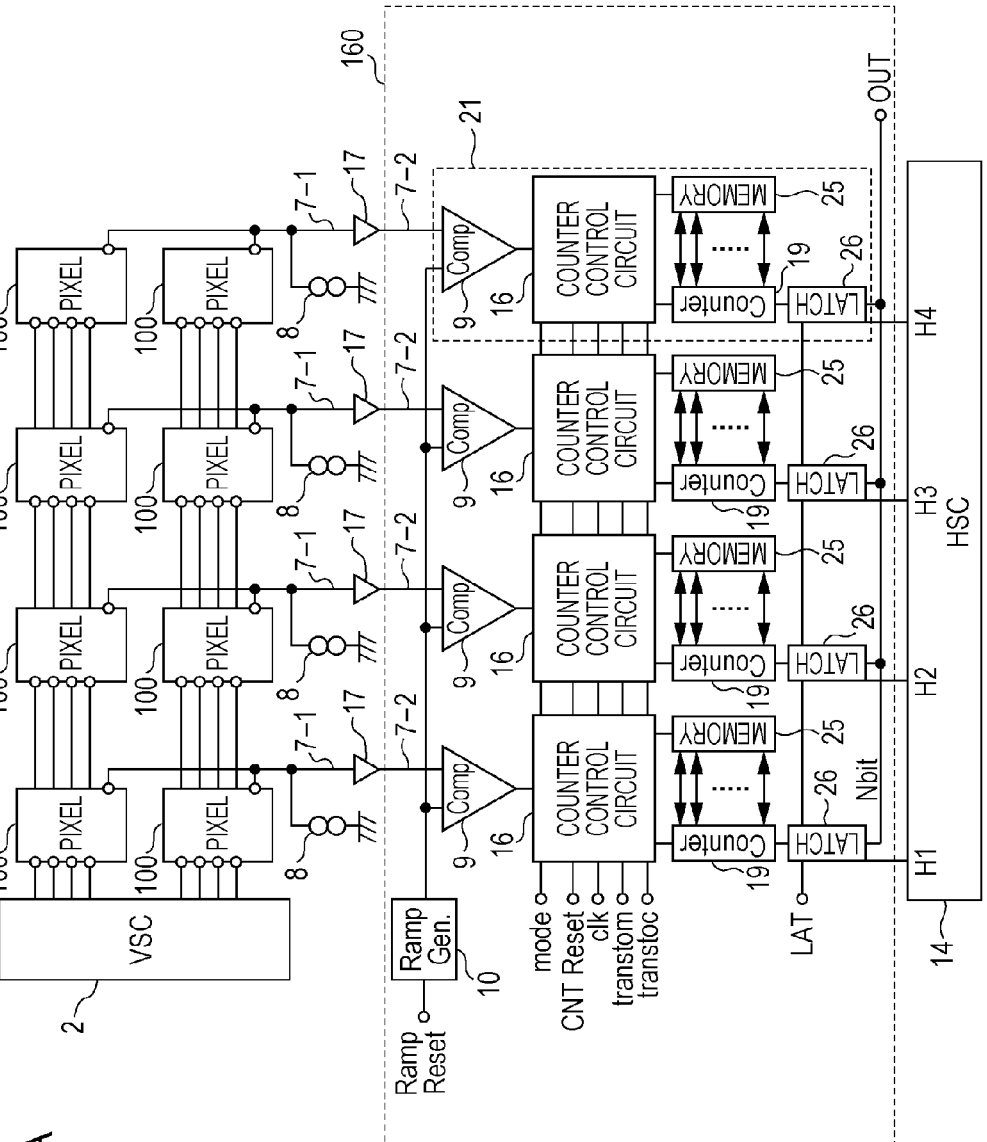
FIG. 6A is a diagram illustrating an example of an equivalent circuit of an imaging device in another form.

FIG. 6A is an equivalent circuit diagram illustrating an example of an imaging device of this exemplary embodiment. The imaging device of this exemplary embodiment is different from that in Exemplary Embodiment 3 in that a mode setting pulse "mode" is supplied to the second counter 19 from a timing generator (not illustrated) via the counter control circuit 16. The mode setting pulse "mode" is a pulse for switching the mode of the second counter 19 described below.

Figure 6B:
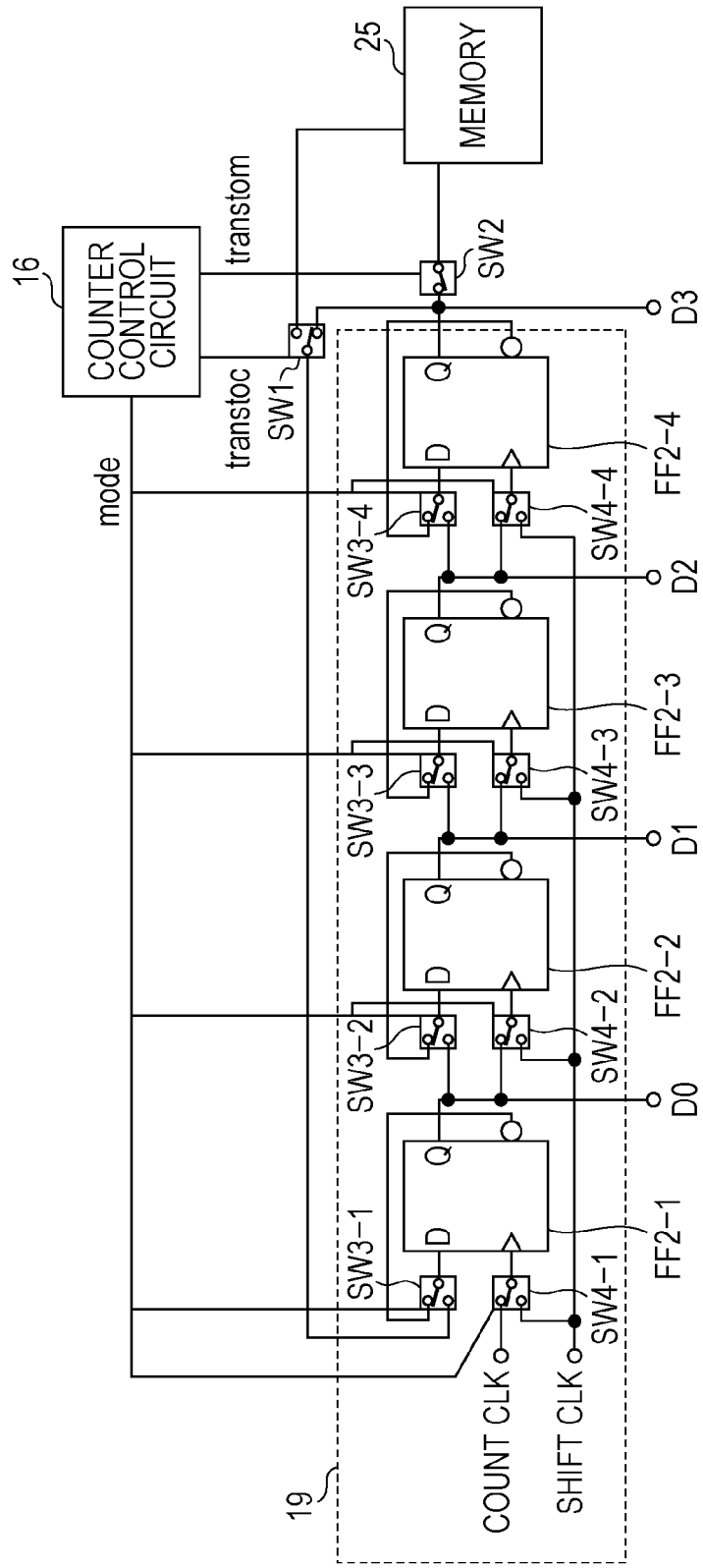
FIG. 6B is a diagram illustrating an example of an equivalent circuit of a counter in the other form.

FIG. 6B is an equivalent circuit diagram illustrating the second counter 19 of this exemplary embodiment illustrated by way of example in FIG. 6A. The second counter 19 of this exemplary embodiment is configured such that flip-flop circuits FF2-1 to FF2-4 are electrically connected in such a manner that the output of the non-inverting output terminal Q of the preceding stage is connected to the input of the clock terminal of the subsequent stage. Further, the outputs of the non-inverting output terminals Q of the flip-flop circuits FF2-1 to 2-4 are supplied as D0 to D3 to the latches 26. Further, the counter control circuit 16 supplies a mode setting pulse "mode" to switches SW3-1 to 3-4 electrically connected to terminals D of the flip-flop circuits FF2-1 to 2-4 and switches SW4-1 to 4-4 electrically connected to clock pulse terminals to switch a mode. Further, the timing generator (not illustrated) supplies a pulse "transtoc" and a pulse "transtom" to a switch SW1 and a switch SW2, respectively, via the counter control circuit 16. When the mode setting pulse "mode" is at the L level, an inverting output terminal NQ of each of the flip-flop circuits FF2-1 to 2-4 is electrically connected to the terminal D of the flip-flop circuit. Further, a count CLK is supplied to the clock pulse terminal. On the other hand, when the mode setting pulse "mode" is at the H level, the terminal D of each of the flip-flop circuits FF2-1 to FF2-4 is electrically connected to the non-inverting output terminal Q of the preceding flip-flop circuit. Further, when the mode setting pulse "mode" is at the H level, a shift CLK is supplied to the clock pulse terminals of the flip-flop circuits FF2-1 to 2-4. Further, when the pulse "transtom" to be supplied to the switch SW2 is at the H level, the non-inverting output terminals Q of the flip-flop circuits FF2-4 and a memory 25 are electrically connected. Thus, when both the mode setting pulse "mode" and the pulse "transtom" are at the H level, the signals output from the flip-flop circuits FF2-1 to FF2-4 are sequentially output to the memory 25. The memory 25 is, for example, a shift register circuit, and holds a count signal having signals output from the flip-flop circuits FF2-1 to FF2-4, which are sequentially output. Further, when both the mode setting pulse "mode" and the pulse "transtoc" are at the H level, the terminal D of the flip-flop circuit FF2-1 is electrically connected to the memory 25 via the switch SW1. Thus, the count signal held in the memory 25 is sequentially supplied to the flip-flop circuits FF2-1 to FF2-4.

Figure 7:
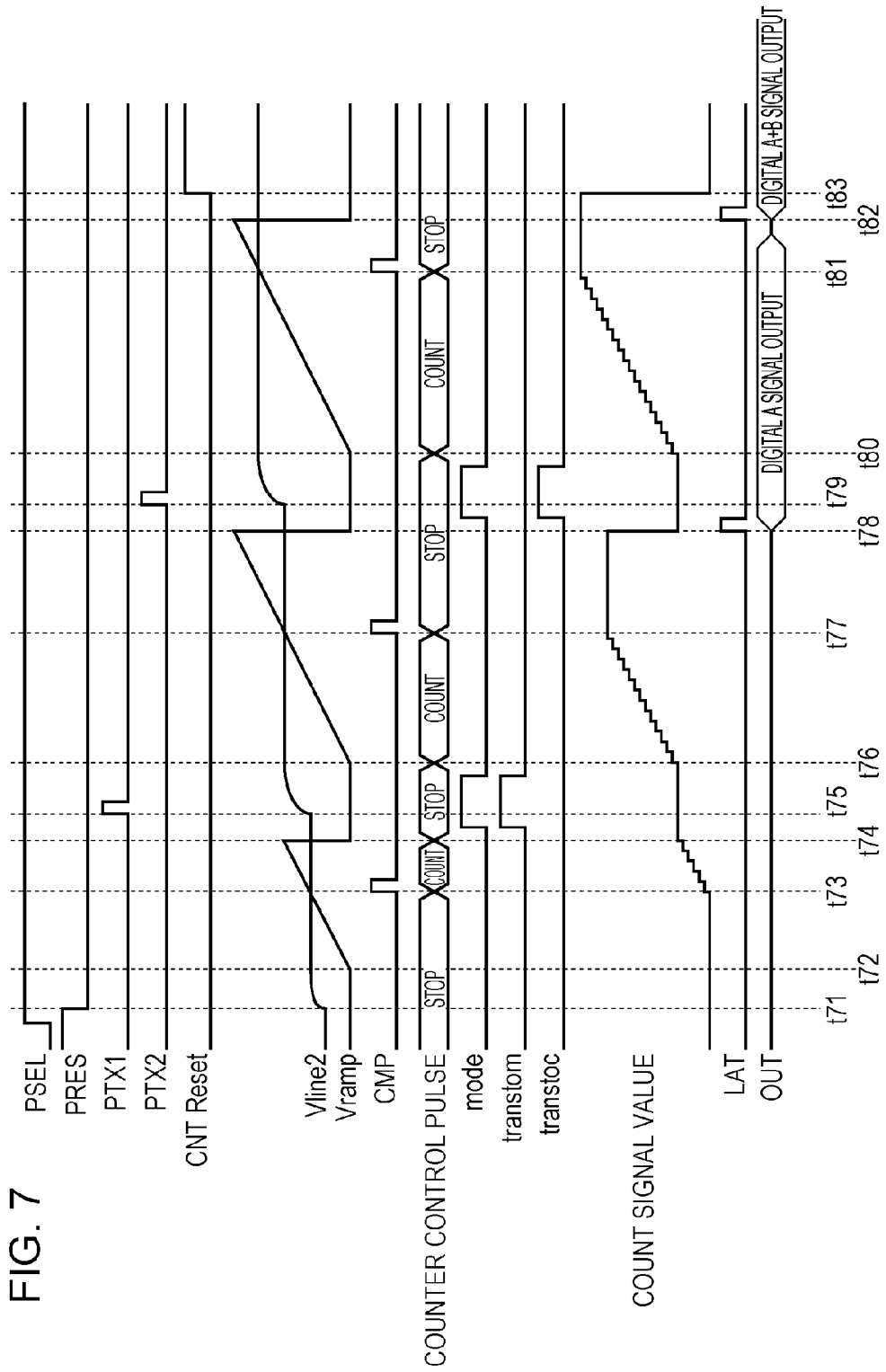
FIG. 7 is a diagram illustrating an example of the operation of the imaging device in the other form.

FIG. 7 is a timing chart illustrating an example of the operation of the imaging device illustrated by way of example in FIG. 6A. The following description will be made hereinafter focusing on a portion different from the operation described above in Exemplary Embodiment 3 with reference to FIG. 5.

At time t71, the mode setting pulse "mode" is at the L level. Other operation may be similar to the operation at the time t51 illustrated in FIG. 5.

The operation from time t72 to time t74 may be similar to the operation from the time t52 to the time t54 illustrated in FIG. 5.

During an arbitrary period from time t74 to time t76, the mode setting pulse "mode" and the pulse "transtom" are set to the H level. Thus, the count signal value obtained at the time t74 is held in the memory 25.

Other operation from the time t74 to the time t76 and the operation from time t77 to time t78 may be similar to the operation from the time t54 to the time t58 illustrated in FIG. 5.

During an arbitrary period from time t78 to time t80, the mode setting pulse "mode" and the pulse "transtoc" are set to the H level. Thus, the count signal value obtained at the time t74 which is held in the memory 25 during the arbitrary period from the time t74 to the time t76 is set in the second counter 19.

Other operation from the time t78 to the time t80 may be similar to that from the time t58 to the time t61 illustrated in FIG. 5.

The operation from time t81 to time t83 may also be similar to the operation from the time t62 to the time t64 illustrated in FIG. 5.

As described above, the imaging device of this exemplary embodiment can also acquire a digital A signal and a digital A+B signal.

The imaging device of this exemplary embodiment can also achieve advantages similar to those in Exemplary Embodiment 3.

Exemplary Embodiment 5

An imaging device of this exemplary embodiment will be described hereinafter with reference to the drawings.

This exemplary embodiment is a form in which focal point detection based on a phase difference detection method is performed using pixel signals output from pixels 100 provided in the imaging device.

Figure 8A:
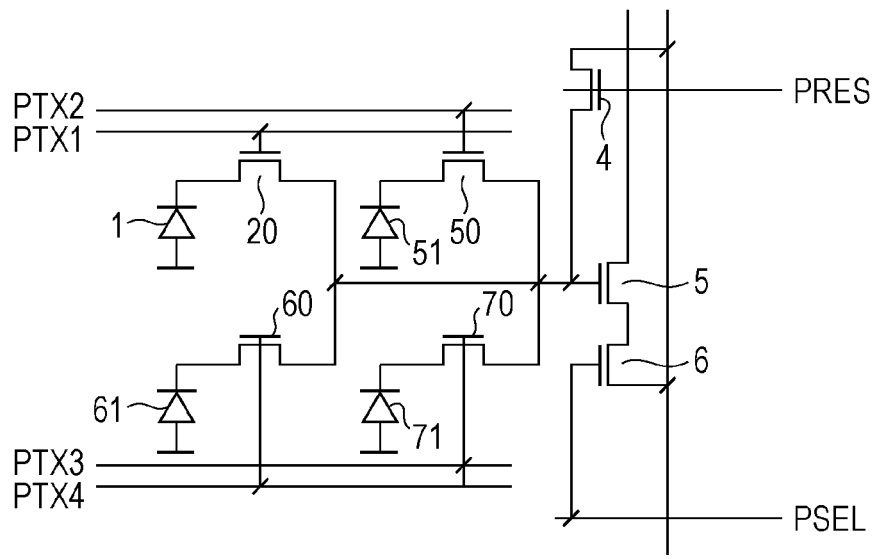
FIG. 8A is a diagram illustrating an example of an equivalent circuit of a pixel in another form.

FIG. 8A is an equivalent circuit diagram illustrating an example of a pixel having four photoelectric conversion units, that is, photodiodes 1, 51, 61, and 71.

Signal charge generated in the photodiodes 1, 51, 61, and 71 is transferred to a gate of an amplification MOS transistor 5 via transfer MOS transistors 20, 50, 60, and 70, respectively. Similarly to the imaging device described above using FIG. 1B, a transfer pulse PTX1 is supplied to a gate of the transfer MOS transistor 20 from the vertical scanning circuit 2. Also, similarly to the imaging device described above using FIG. 1B, a transfer pulse PTX2 is supplied to the transfer MOS transistor 50, a transfer pulse PTX3 is supplied to the transfer MOS transistor 60, and a transfer pulse PTX4 is supplied to the transfer MOS transistor 70 from the vertical scanning circuit 2. The imaging device of this exemplary embodiment can be implemented regardless of which of the configurations described above in Exemplary Embodiments 1 to 4 the analog-digital conversion unit has. In the following description, an imaging device including the analog-digital conversion unit 160 according to Exemplary Embodiment 1 will be described.

Figure 8B:
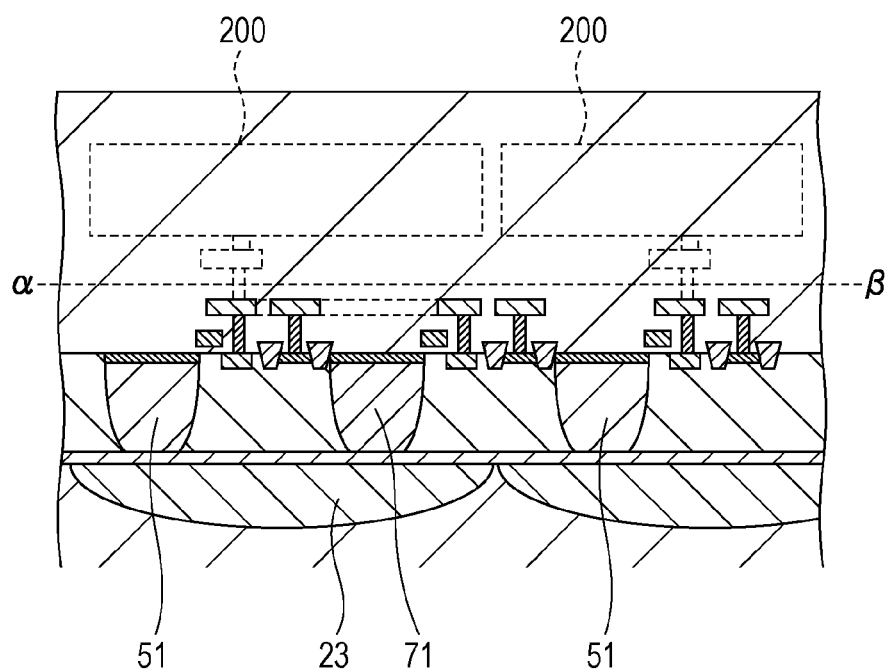
FIG. 8B is a diagram illustrating an example of a cross section of the pixel in the other form.

FIG. 8B is a cross-sectional view of two photodiodes included in the pixel 100 illustrated in FIG. 8A. FIG. 8B illustrates a so-called back-illuminated imaging device in which the photodiodes 1, 51, 61, and 71 are disposed between one microlens 23 and circuit units 200. This exemplary embodiment may be implemented, as desired, with a back-illuminated imaging device. The circuit units 200 and the photodiodes 1, 51, 61, and 71 may be formed on separate substrates, and both substrates may be electrically connected to form a back-illuminated imaging device. An example of separating components into substrates is indicated by a line segment α-β. Further, an inner lens may further be disposed between the microlens 23 and the photodiodes 1, 51, 61, and 71 to improve the efficiency of collection of light onto photodiodes.

Figure 9:
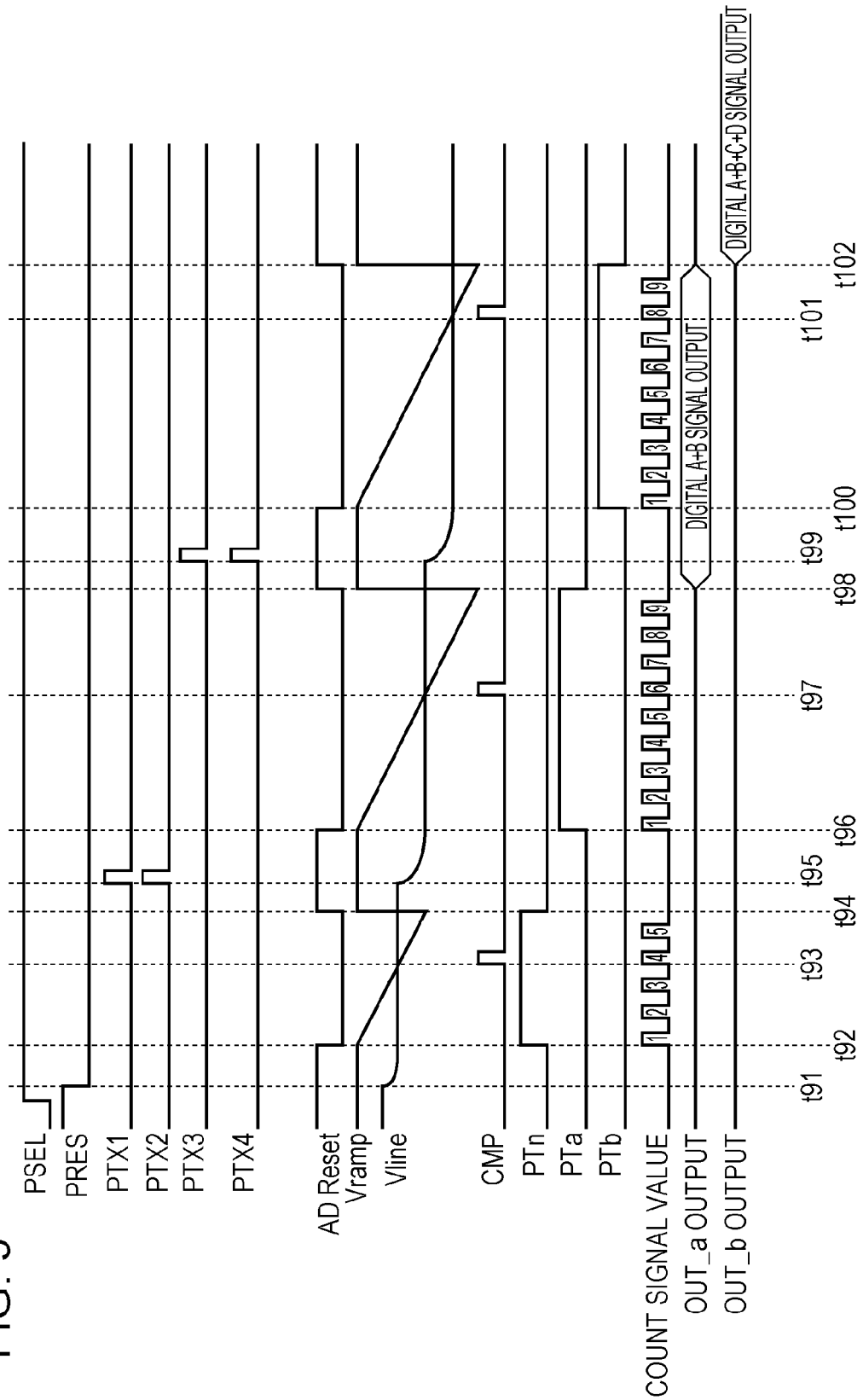
FIG. 9 is a diagram illustrating an example of the operation of an imaging device in another form.

FIG. 9 is a timing chart illustrating an example of the operation of the imaging device in FIG. 8A. A description will be made focusing on a portion different from the timing described above in Exemplary Embodiment 1 using FIG. 2.

The operation from time t91 to time t94 may be similar to the operation from the time t11 to the time t14 in Exemplary Embodiment 1.

At time t95, the transfer pulses PTX1 and PTX2 are set to the H level. Thus, the signal charge generated in the photodiodes 1 and 51 is transferred to the gate of the amplification MOS transistor 5. The pixel signal to be output to the vertical signal line 7 at this time is a P(A+B+N) signal in which the sum of the PA signal based on the signal charge of the photodiode 1 and the PB signal based on the signal charge of the photodiode 51 is superimposed on the PN signal. The signal output operation from the pixel 100 to the vertical signal line 7 at the time t95 is represented as a first pixel output operation in this exemplary embodiment.

The operation from time t96 to time t98 may be similar to the operation from the time t16 to the time t18 in Exemplary Embodiment 1. Thus, a digital A+B+N signal obtained by converting the P(A+B+N) signal into a digital signal can be obtained.

At time t99, the transfer pulses PTX3 and PTX4 are set to the H level. Thus, the signal charge generated in the photodiodes 61 and 71 is transferred to the gate of the amplification MOS transistor 5 that has already held the signal charge generated in the photodiodes 1 and 51 at the time t96. Thus, a P(A+B+C+D+N) signal in which a signal obtained by adding together a P(A+B) signal, a PC signal based on the signal charge in the photodiode 61, and a PD signal based on the signal charge in the photodiode 71 is superimposed on the PN signal is output to the vertical signal line 7. The signal output operation from the pixel 100 to the vertical signal line 7 at the time t99 is represented as a second pixel output operation in this exemplary embodiment.

The operation from time t100 to time t102 may be similar to the operation from the time t20 to the time t22 in Exemplary Embodiment 1. Thus, a digital A+B+C+D+N signal obtained by converting the P(A+B+C+D+N) signal into a digital signal can be obtained.

The difference signal output unit 15-2 outputs a digital A signal. The digital A signal is a first difference signal between the digital A+N signal converted from the second signal and the digital N signal converted from the first signal. The difference signal output unit 15-1 outputs a digital A+B signal. The digital A+B signal is a second difference signal between the digital A+B+N signal converted from the third signal and the digital N signal converted from the first signal.

In the first pixel output operation described above, the P(A+B+N) signal is output to the vertical signal line 7 from the pixel 100. However, this exemplary embodiment is not limited to this combination, and the operation based on a phase difference detection method can be implemented, as desired, with a form in which signal charge is transferred to the gate of the amplification MOS transistor 5 from two different photodiodes. The details will be described below using FIGS. 11B to 11D.

Figure 11A:
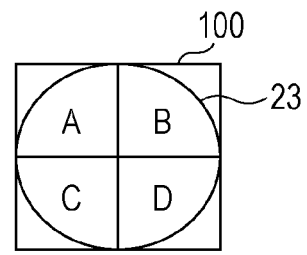
FIG. 11A is a diagram illustrating an example of the arrangement of a pixel in another form.

Next, FIG. 11A illustrates an example of the arrangement of a pixel 100 having four photodiodes and a microlens 23. The imaging device of this exemplary embodiment includes a microlens array having a plurality of microlenses 23, and one microlens 23 is disposed for one pixel 100. In FIGS. 11A, A, B, C, and D represent exemplary locations of photodiodes that generate signal charge for obtaining PA, PB, PC, and PD signals, respectively. For example, the photodiode 1 described above in conjunction with FIG. 8A is disposed in the region represented by A.

Figure 11B:
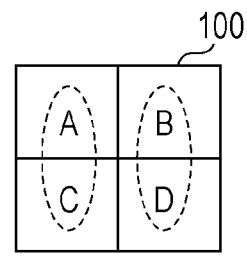
FIG. 11B is a diagram illustrating an example of the arrangement of a pixel in another form.
Figure 11C:
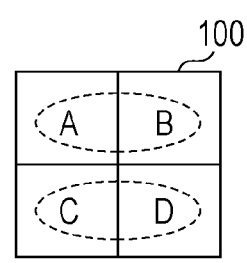
FIG. 11C is a diagram illustrating an example of the arrangement of a pixel in another form.
Figure 11D:
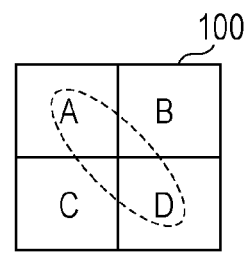
FIG. 11D is a diagram illustrating an example of the arrangement of a pixel in another form.

Next, an example of focal point detection based on a phase difference detection method will be described using FIGS. 11B to 11D. In FIGS. 11B to 11D, signals in a region surrounded by an ellipse are added together, and a resulting signal is output to the vertical signal line 7. That is, in FIG. 11B, in the first pixel output operation, the P(A+C) signal or the P(B+D) signal is output from the pixel 100 to the vertical signal line 7. Similarly, in FIG. 11C, in the first pixel output operation, the P(A+B+N) signal or the P(C+D+N) signal is output from the pixel 100 to the vertical signal line 7. Similarly, in FIG. 11D, in the first pixel output operation, the P(A+D+N) signal or the P(B+C+N) signal is output from the pixel 100 to the vertical signal line 7. In the second pixel output operation, a P(A+B+C+D+N) signal is output in any of the forms in FIGS. 11B to 11D. The first signal output from the analog signal output unit in the forms in FIGS. 11B to 11D is a PN signal. Further, the second signal in FIG. 11B is a P(A+C+N) signal or a P(B+D+N) signal. Further, the second signal in FIG. 11C is a P(A+B+N) signal or a P(C+D+N) signal. The second signal in FIG. 11D is a P(A+D+N) signal or a P(B+C+N) signal. Further, the third signal in the forms in FIGS. 11B to 11D is a P(A+B+C+D+N) signal.

Next, an imaging system including the imaging device of this exemplary embodiment will be described. Examples of the imaging system may include a digital still camera, a digital camcorder, and a security camera. FIG. 12 illustrates a schematic diagram of an example of the imaging system when the imaging device of this exemplary embodiment is used as a digital still camera.

In FIG. 12, an imaging system includes a barrier 151 for protecting a lens, a lens 152 for forming an optical image of a subject on an imaging device 154 of this exemplary embodiment, an aperture stop 153 for varying the amount of light transmitted through the lens 152, and an output signal processing unit 155 that processes an output signal output from the imaging device 154. The output signal processing unit 155 is a digital signal processing unit that processes a digital signal output from the imaging device 154. The lens 152 and the aperture stop 153 form an optical system that collects light onto the imaging device 154. The imaging device 154 outputs a digital signal converted from a second signal and a digital signal converted from a third signal. The output signal processing unit 155 can perform a differential processing for subtracting a digital A signal from a digital A+B signal to obtain a digital B signal. Further, the output signal processing unit 155 performs other operations of performing various correction and compression operations on a signal, if necessary, and outputting the resulting signal.

The imaging system illustrated by way of example in FIG. 12 further includes a buffer memory unit 156 for temporarily storing image data, and an external interface unit 157 for communicating with an external computer and the like. The imaging system further includes a removable recording medium 159 for recording or reading captured image data, such as a semiconductor memory, and a recording medium control interface unit 158 for recording on or reading from the recording medium 159. The imaging system further includes an overall control/computation unit 1510 that performs various computations and controls the entire digital still camera, and a timing generation unit 1511 that outputs various timing signals to the imaging device 154 and the output signal processing unit 155. Here, the timing signals and the like may be input from outside, and the imaging system may at least include the imaging device 154 and the output signal processing unit 155 that processes an output signal output from the imaging device 154.

In the form in FIG. 11B, it is assumed that, for example, a P(A+C+N) signal is output in the first pixel output operation, and a digital A+C+N signal is obtained through the digital conversion described above using FIG. 9. A P(A+B+C+D+N) signal is output in the second pixel output operation, and digital conversion is performed in a manner similar to that for the P(A+C+N) signal to obtain a digital A+B+C+D+N signal. The difference signal output unit 15 outputs a digital A+C signal and a digital A+B+C+D signal. The output signal processing unit 155 obtains a digital (B+D)' signal that is a difference between the digital A+B+C+D signal and the digital A+C signal output from the imaging device. The digital (B+D)' signal is a signal corresponding to a digital B+D signal obtained by performing digital conversion on a P(B+D) signal that is assumed to be output from the pixel 100 although the P(B+D) signal is not output from the pixel 100 in this form. A phase difference in a column of photodiodes can be detected using the digital A+C signal and the digital (B+D)' signal, and focal point detection can be performed.

Similarly, in FIG. 11C, a phase difference in a row of photodiodes can be detected, and focal point detection can be performed. Further, in FIG. 11D, a phase difference in the diagonal direction of the photodiodes can be detected, and focal point detection can be performed.

Figure 11E:
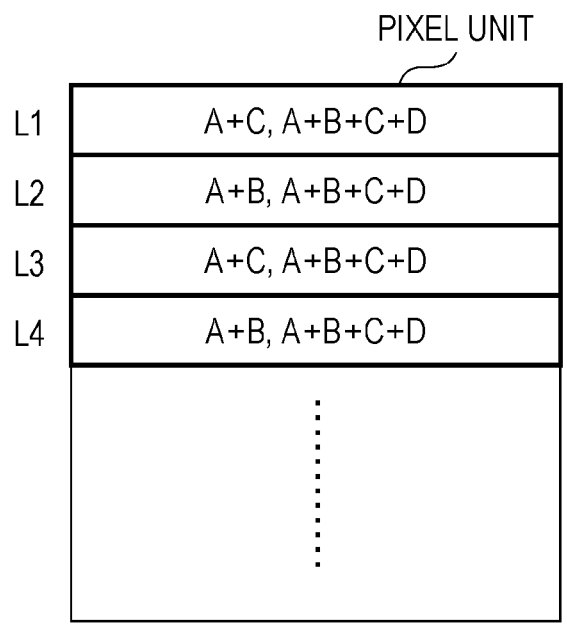
FIG. 11E is a diagram illustrating an example of the operation of a pixel in another form.

Next, the signal output operation for each row of a pixel unit will be described using FIG. 11E. FIG. 11E illustrates a schematic representation of a pixel unit, and L1 to L4 represent the first to fourth pixel rows, respectively, starting from the top in FIG. 11E. Further, the row L1 shows "A+C, A+B+C+D", which indicates that P(A+C+N) signals that are signals including P(A+C) signals are output from the pixels 100 to the vertical signal lines 7 in the first pixel output operation and P(A+B+C+D+N) signals that are signals including P(A+B+C+D) signals are output from the pixels 100 to the vertical signal lines 7 in the second pixel output operation. The same applies to the rows L2 to L4. This arrangement allows a phase difference in a column of photodiodes to be detected in the pixels 100 in the row L1, and a phase difference in a row of photodiodes to be detected in the pixels 100 in the row L2. Therefore, phase differences in each column or row of photodiodes can be detected in each row of pixels 100. In addition, a row for detecting a phase difference in the diagonal direction of photodiodes, as in FIG. 11D, may be provided, if necessary.

Further, the P(A+B+C+D) signals obtained in the second pixel output operation are pixel signals based on light incident on all the photodiodes included in the pixels 100. Thus, in order to obtain an image based on light incident on the pixels 100, an image may be generated using digital A+B+C+D signals converted from the P(A+B+C+D) signals.

Figure 10:
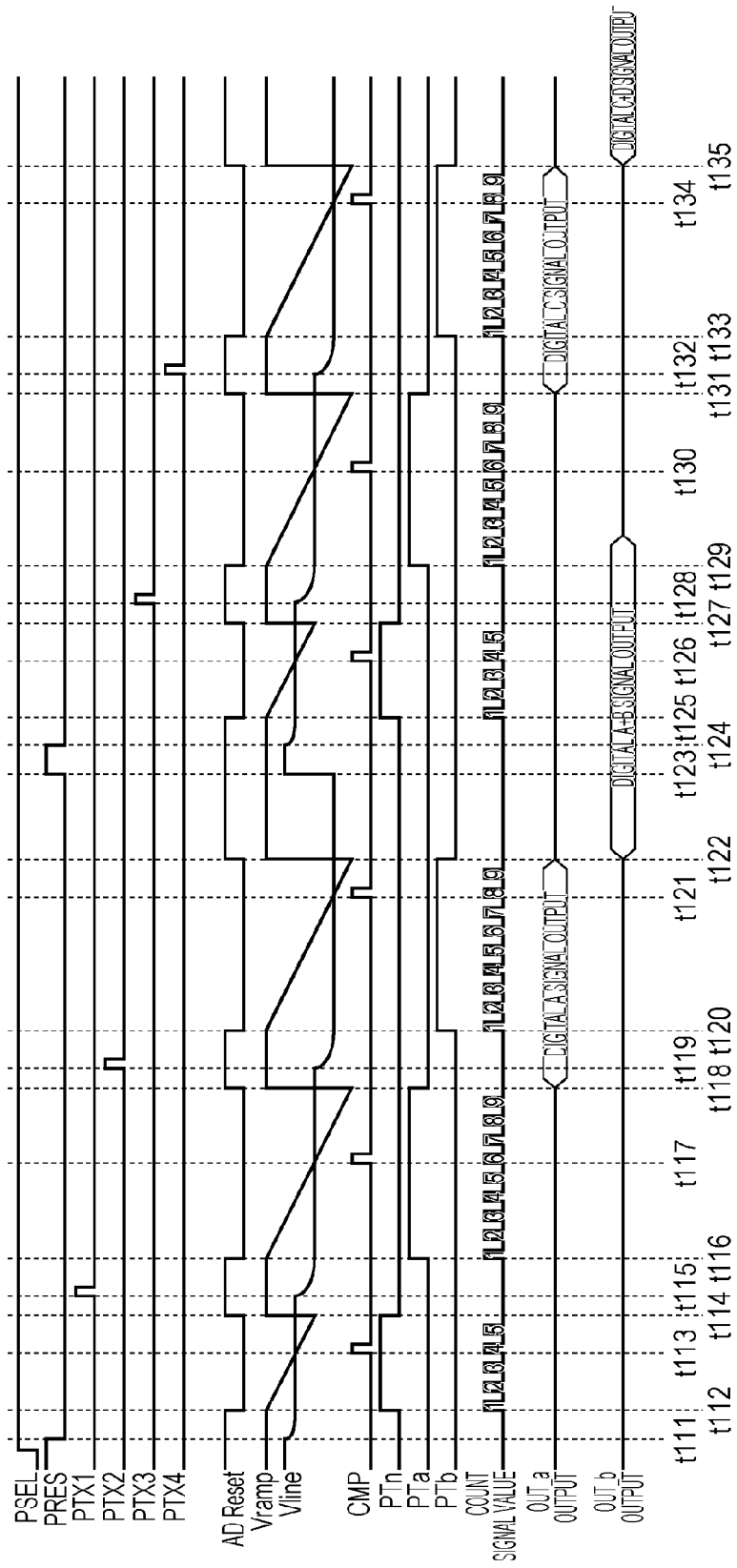
FIG. 10 is a diagram illustrating an example of the operation of an imaging device in another form.
Figure 11F:
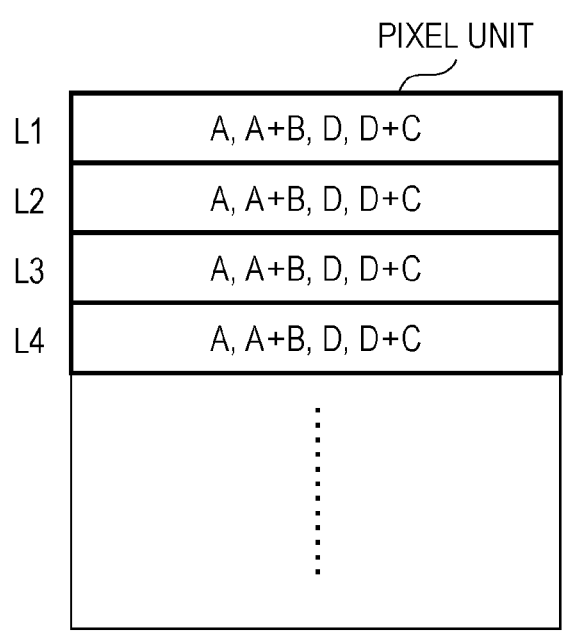
FIG. 11F is a diagram illustrating an example of the operation of a pixel in another form.

Next, another form of the signal output operation for each row of a pixel unit will be described using FIG. 11F. In FIG. 11F, symbols represent elements similar to those in FIG. 11E. In the signal output operation in FIG. 11F, the pixels 100 in each row output PN signals, P(A+N) signals, P(A+B+N) signals, P(D+N) signals, and P(D+C+N) signals to the vertical signal lines 7 in a time-shared manner. This output operation will be described with reference to FIG. 10. FIG. 10 illustrates a form in which the Latch_n 13-1 is a double buffer memory having a plurality of memories each capable of holding a digital N signal.

The operation from time t111 to time t114 may be similar to the operation from the time t91 to the time t94 described above with reference to FIG. 9.

At time t115, the transfer pulse PTX1 is set to the H level. Thus, a P(A+N) signal is output from the pixel 100 to the vertical signal line 7.

The operation from time t116 to time t118 may be similar to the operation from the time t96 to the time t98 described above with reference to FIG. 9. Thus, a digital A+N signal obtained by converting the P(A+N) signal into a digital signal can be obtained.

At time t119, the transfer pulse PTX2 is set to the H level. Thus, a P(A+B+N) signal is output from the pixel 100 to the vertical signal line 7.

The operation from time t120 to time t122 may be similar to the operation from the time t100 to the time t102 described above with reference to FIG. 9. Thus, a digital A+B+N signal obtained by converting the P(A+B+N) signal into a digital signal can be obtained.

At time t123, the reset pulse PRES is set to the H level. Thus, the potential of the gate of the amplification MOS transistor 5 has a reset level.

The operation from time t124 to time t127 may be similar to the operation from the time t111 to the time t114 described above. Since the Latch_n 13-1 is a double buffer memory, the period of N conversion and the period during which the digital N signal held at the time t114 is transferred to the difference signal output unit 15-1 may overlap.

At time t128, the transfer pulse PTX3 is set to the H level. Thus, a P(D+N) signal is output from the pixel 100 to the vertical signal line 7.

The operation from time t129 to time t131 may be similar to the operation from the time t116 to the time t118 described above. Thus, a digital D+N signal obtained by converting the P(D+N) signal into a digital signal can be obtained.

At time t132, the transfer pulse PTX4 is set to the H level. Thus, a P(D+C+N) signal is output from the pixel 100 to the vertical signal line 7.

The operation from time t133 to time t135 may be similar to the operation from the time t120 to the time t122 described above. Thus, a digital D+C+N signal obtained by converting the P(D+C+N) signal into a digital signal can be obtained.

A PN signal is converted into a digital N signal again using the operation from the time t125 to the time t127. In a form, this operation may be omitted and only the digital N signal obtained from the time t112 to the time t115 may be used.

As described above, a digital A signal, a digital A+B signal, a digital D signal, and a digital D+C signal are output from an imaging device. In this form, n photoelectric conversion units include the photodiodes 1 and 51, and p (p is a natural number) photoelectric conversion units different from the n photoelectric conversion units include the photodiode 71. Further, q (q is a natural number) photoelectric conversion units different from the n photoelectric conversion units, where q is greater than p, include the photodiodes 61 and 71. This form has been described in the context of n=2, p=1, and q=2. However, this exemplary embodiment is not limited to this form, and the number of photoelectric conversion units may be changed as desired. That is, the numbers of photoelectric conversion units, i.e., m, n, p, and q, may satisfy the relational expressions of m<n and p<q.

The output signal processing unit 155 obtains a digital B' signal that is a difference between the digital A signal and the digital A+B signal output from the imaging device. The digital B' signal is a signal corresponding to the digital B signal obtained by performing digital conversion on a B signal that is assumed to be output from the pixel 100. A phase difference in a column of photodiodes can be detected using the digital A signal and the digital B' signal. Similarly, the output signal processing unit obtains a digital C' signal that is a difference between a digital D signal and a digital D+C signal. The digital C' signal is a signal corresponding to a digital C signal obtained by performing digital conversion on a C signal that is assumed to be output from the pixel 100. A phase difference in a column of photodiodes can be detected using the digital D signal and the digital C' signal. That is, in the form in FIG. 11F, phase difference detection using the digital A signal and the digital B' signal and phase difference detection using the digital C' signal and the digital D signal can be performed with one pixel 100. Focal point detection can be performed by using each of the two phase difference detection operations or combining them as desired. The accuracy of focal point detection can be improved compared to the signal output operation in FIG. 11E.

The operation in FIG. 11F has been described in the context of the form in which, by way of example, the pixel 100 outputs P(A+N), P(A+B+N), P(D+N), and P(D+C+N) signals. However, other forms may be used. That is, any form may be used as long as a pixel signal based on signal charge in one given photodiode and a pixel signal based on signal charge in two photodiodes including the given photodiode are output.

The imaging device of this exemplary embodiment is not limited to only the operations in FIGS. 11E and 11F, and the operations in FIGS. 11E and 11F may be used in combination, as desired. For example, after P(A+N) and P(A+B+N) signals are output from the pixel 100, a P(A+B+C+D+N) signal may be output.

Figure 11G:
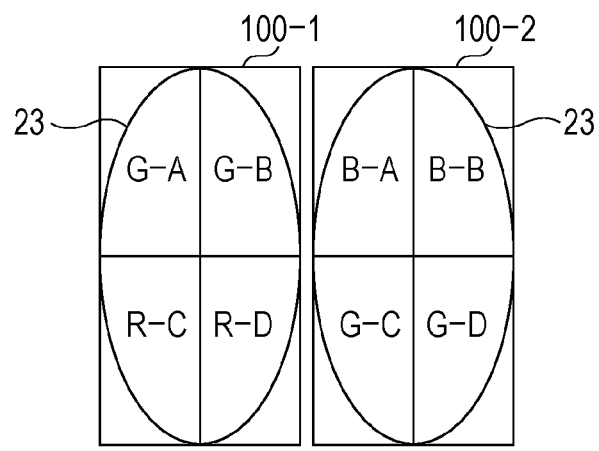
FIG. 11G is a diagram illustrating an example of the arrangement of a pixel in another form.
Figure 11H:
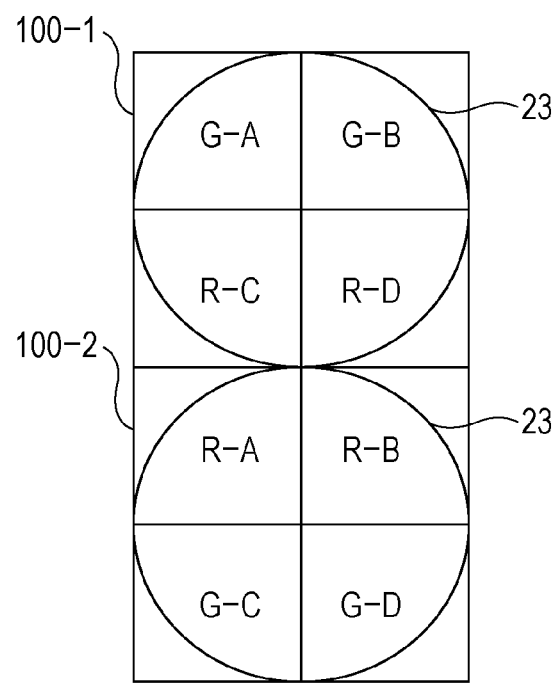
FIG. 11H is a diagram illustrating an example of the arrangement of a pixel in another form.

FIG. 11G illustrates an example of the arrangement of photodiodes and color filters (RGB). In FIG. 11G, two pixels 100-1 and 100-2 are illustrated. In FIG. 11G, the arrangement relationship between colors of color filters and photodiodes that generate signal charge for obtaining PA, PB, PC, and PD signals is illustrated in the order of "the colors of the color filters and photodiodes that generate signal charge for obtaining PA, PB, PC, and PD signals". That is, a region labeled "G-A" is a region where a green (G) color filter is disposed and where a photodiode 1 that generates signal charge for outputting a PA signal is disposed. Color filters of the same color are disposed on one row and two columns of photodiodes in one pixel 100. Further, in two pixels 100-1 and 100-2, color filters of different colors are disposed in a Bayer pattern such that color filters of the same color are arranged in units of one row and two columns. In this form, preferably, each of the pixels 100-1 and 100-2 outputs a pixel signal in a manner similar to that in FIG. 11C described above. This is because the use of light incident on photodiodes through color filters of the same color provides high accuracy for focal point detection. Furthermore, in a form, focal point detection may be performed using pixel signals output from a plurality of pixels 100. For example, in a form, focal point detection may be performed by detecting a phase difference using a combination of a digital A signal and a digital B signal converted from a pixel signal of the pixel 100-1, a combination of a digital C signal and a digital D signal converted from a pixel signal of the pixel 100-2, and a combination of a digital A+B signal and a digital C+D signal, which are output from the photodiodes included in the region where the color filters of green (G) are disposed. Furthermore, in this form of focal point detection, either a combination of a digital A signal and a digital B signal or a combination of a digital C signal and a digital D signal, and a combination of a digital A+B signal and a digital C+D signal may be used. Moreover, in FIG. 11G, a form is illustrated in which focal point detection is performed using the pixels 100-1 and 100-2 disposed in the horizontal direction (the direction in which the HSC 14 scans). In contrast, FIG. 11H illustrates an example of the arrangement of color filters when focal point detection is performed using pixels 100-1 and 100-2 disposed in the vertical direction (the direction in which the VSC 2 scans). Also in the form in which focal point detection is performed using a plurality of pixels 100 disposed in the vertical direction, preferably, each of the pixels 100-1 and 100-2 outputs a pixel signal in a manner similar to that in FIG. 11C described above. In the arrangement of the color filters in the pixel 100-1 and the pixel 100-2, it may only be required that at least color filters disposed at adjacent photoelectric conversion units in the pixel 100-1 and the pixel 100-2 are of the same color. That is, in the form in FIG. 11H, it may only be required that "R-A" and "R-B" having color filters of the same color in the pixel 100-2 are arranged adjacent to "R-C" and "R-D" in the pixel 100-1. Moreover, preferably, as in FIG. 11H, the color filters in the pixel 100-2 are arranged so as to be inverted upside down with respect to the color filters in the pixel 100-1.

This exemplary embodiment has been described on the basis of a form including the pixels 100 each illustrated by way of example in FIG. 8A and the analog-digital conversion unit 160 of Exemplary Embodiment 1. In another form, as described above, an imaging device including the pixels 100 each illustrated by way of example in FIG. 8A and the analog-digital conversion unit 160 described above in Exemplary Embodiments 2 to 5 may be implemented as desired. In addition, the pixel 100 in FIG. 8A has four photodiodes; however, this exemplary embodiment is not limited to the number. That is, a configuration including pixels 100 each of which includes a plurality of photodiodes and each of which is provided with one microlens may be implemented as desired. Even the forms described above can achieve advantages described above in Exemplary Embodiments 1 to 4, and can also provide the advantage of performing focal point detection based on a phase difference detection method, as desired.

Exemplary Embodiment 6

An exemplary embodiment in which the imaging device described above in any of Exemplary Embodiments 1 to 4 is used in an imaging system will be described. Examples of the imaging system may include a digital still camera, a digital camcorder, and a security camera. A schematic diagram of an example of the imaging system of this exemplary embodiment in which an imaging device is used as a digital still camera may be similar to that in FIG. 12, in conjunction with which Exemplary Embodiment 5 has been described.

As described above, the imaging system of this exemplary embodiment is capable of performing an imaging operation using the imaging device 154.

The present invention is not limited to the foregoing embodiments, and a variety of changes and modifications can be made without departing from the spirit and scope of the present invention. Therefore, the following Claims are appended to clearly define the scope of the present invention.

An embodiment of the present invention can provide an imaging device that can obtain the A signal and the A+B signal without holding a noise signal output from a pixel in a plurality of capacitors, thereby more accurately generating the A signal and the A+B signal.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of International Patent Application No. PCT/JP2012/054978, filed Feb. 28, 2012, which is hereby incorporated by reference herein in its entirety.

The invention claimed is:

1. An imaging device comprising an analog signal output unit and an analog-digital conversion unit,
the analog signal output unit including a pixel,
the pixel having a photoelectric conversion unit,
the analog signal output unit outputting
a first signal that is a noise signal in the analog signal output unit,
a second signal based on signal charge generated in the photoelectric conversion unit, and
a third signal based on signal charge obtained by adding other signal charge generated in the photoelectric conversion unit to the signal charge,
the analog-digital conversion unit converting each of the first, second, and third signals into a digital signal,
the analog-digital conversion unit including a signal holding unit that holds the digital signal converted from the first signal,
wherein the analog-digital conversion unit generates a first difference signal between the digital signal converted from the second signal and the digital signal converted from the first signal, and a second difference signal between the digital signal converted from the third signal and the digital signal converted from the first signal, and
wherein the digital signal converted from the first signal, held in the signal holding unit, is commonly used in both generating the first difference signal and generating the second difference signal.

2. An imaging device comprising an analog signal output unit and an analog-digital conversion,
the analog signal output unit including a pixel,
the pixel having at least n (n is a natural number of 2 or more) photoelectric conversion units,
the analog signal output unit outputting
a first signal that is a noise signal in the analog signal output unit,
a second signal based on signal charge generated in m (m is a natural number satisfying a relational expression of n >m) photoelectric conversion units among the n photoelectric conversion units, and
a third signal based on signal charge generated in the n photoelectric conversion units,
the analog-digital conversion unit converting each of the first, second, and third signals into a digital signal,
the analog-digital conversion unit including a signal holding unit that holds the digital signal converted from the first signal,
wherein the analog-digital conversion unit generates a first difference signal between the digital signal converted from the second signal and the digital signal converted from the first signal, and a second difference signal between the digital signal converted from the third signal and the digital signal converted from the first signal, and
wherein the digital signal converted from the first signal, held in the signal holding unit, is commonly used in both generating the first difference signal and generating the second difference signal.

3. The imaging device according to claim 2, wherein the imaging device further comprises a microlens array having a plurality of microlenses, and
wherein one of the microlenses collects light onto the plurality of photoelectric conversion units in the pixel to make the light incident on the plurality of photoelectric conversion units.

4. The imaging device according to claim 1, wherein the analog-digital conversion unit includes a comparator and a counter,
wherein the comparator outputs comparison result signals obtained as a result of comparing each of the first, second, and third signals with a reference signal whose potential changes with time, wherein the counter is supplied with a clock pulse signal, and outputs a count signal obtained by counting pulses of the clock pulse signal, and wherein the analog-digital conversion unit converts the first, second, and third signals into the digital signals on the basis of a timing at which signal values of the comparison result signals change and on the basis of the count signal.

5. The imaging device according to claim 4, wherein the signal holding unit holds the count signal obtained during a period from a timing at which a change in a potential of the reference signal with time begins to a timing at which the signal values of the comparison result signals change.

6. The imaging device according to claim 4, wherein the analog-digital conversion unit includes a plurality of circuit units,
   wherein each of the plurality of circuit units includes the comparator and the signal holding unit,
   wherein the imaging device includes a plurality of analog signal output units, and
   wherein each of the plurality of analog signal output units and each of the plurality of circuit units are provided so as to correspond to each other.

7. The imaging device according to claim 4, wherein the digital signal converted from the first signal is a signal value of the count signal obtained in a period from a timing at which the signal value of the comparison result signal between the first signal and the reference signal changes to a timing at which a change in a potential of the reference signal with time ends, and
   wherein the counter performs, in comparison between the second signal and the reference signal and in comparison between the third signal and the reference signal, counting for a period from a timing at which a change in the potential of the reference signal with time begins to a timing at which the signal values of the comparison result signals change, starting from a signal value of the digital signal converted from the first signal, the signal value being output from the signal holding unit to the counter.

8. The imaging device according to claim 1, wherein the analog signal output unit includes an amplification unit, and
   wherein each of the noise signal and a plurality of the signals is a signal that is obtained by amplifying a signal output from the pixel using the amplification unit and that is output from the amplification unit.

9. An imaging system comprising:
   imaging device;
   an optical system that collects light onto the imaging device; and
   a digital signal processing unit,
   wherein the imaging device comprises an analog signal output unit and an analog-digital conversion unit,
   the analog signal output unit including a pixel,
   the pixel having at least n (n is a natural number of 2 or more) photoelectric conversion units a photoelectric conversion unit,
   the analog signal output unit outputting
   a first signal that is a noise signal in the analog signal output unit,
   a second signal based on signal charge generated in m (m is a natural number satisfying a relation expression of n>m) photoelectric conversion units among the n photoelectric conversion units, and
   a third signal based on signal charge generated in the n photoelectric conversion units, the analog-digital conversion unit converting each of the first, second, and third signals into a digital signal, the analog-digital conversion unit including a signal holding unit that holds the digital signal converted from the first signal, wherein the analog-digital conversion unit generates a first difference signal between the digital signal converted from the second signal and the digital signal converted from the first signal, and a second difference signal between the digital signal converted from the third signal and the digital signal converted from the first signal, wherein the digital signal converted from the first signal, held in the signal holding unit, is commonly used in both generating the first difference signal and generating the second difference signal, wherein the imaging device further comprises a microlens array having a plurality of microlenses, wherein one of the microlenses collects light onto the plurality of photoelectric conversion units in the pixel to make the light incident on the plurality of photoelectric conversion units, wherein the digital signal processing unit inputs the first difference signal and the second difference signal from the imaging device, and wherein the digital signal processing unit obtains a third difference signal that is a difference between the first difference signal and the second difference signal, and performs focal point detection using the third difference signal and the first difference signal.

10. A method for driving an imaging device, the imaging device including an analog signal output unit and an analog-digital conversion unit, wherein
   the analog signal output unit includes a pixel,
   the pixel has a photoelectric conversion unit,
   the analog signal output unit outputs
   a first signal representing a noise signal in the analog signal output unit,
   a second signal based on signal charge generated in the photoelectric conversion unit, and
   a third signal based on signal charge obtained by adding other signal charge generated in the photoelectric conversion unit to the signal charge, and
   the analog-digital conversion unit converts the first, second, and third signals into digital signals,
   wherein the analog-digital conversion unit generates a first difference signal between the digital signal converted from the second signal and the digital signal converted from the first signal, and a second difference signal between the digital signal converted from the third signal and the digital signal converted from the first signal, and
   wherein the digital signal converted from the first signal is commonly used in both generating the first difference signal and generating the second difference signal.

11. A method for driving an imaging device, the imaging device including an analog signal output unit and an analog-digital conversion unit, wherein
   the analog signal output unit includes a pixel,
   the pixel has at least n (n is a natural number of 2 or more) photoelectric conversion units,
   the analog signal output unit outputs
   a first signal representing a noise signal in the analog signal output unit,
   a second signal based on signal charge generated in m (m is a natural number satisfying a relational expression of n>m) photoelectric conversion units among the n photoelectric conversion units, and a third signal based on signal charge generated in the n photoelectric conversion units, and the analog-digital conversion unit converts the first, second, and third signals into digital signals, wherein the analog-digital conversion unit generates a first difference signal between the digital signal converted from the second signal and the digital signal converted from the first signal, and a second difference signal between the digital signal converted from the third signal and the digital signal converted from the first signal, and wherein the digital signal converted from the first signal is commonly used in both generating the first difference signal and generating the second difference signal.

12. The method for driving an imaging device according to claim 11, wherein after outputting the first, second, and third signals, the analog signal output unit outputs a signal based on signal charge generated in p (p is a natural number) photoelectric conversion units different from the n photoelectric conversion units, and a signal based on signal charge generated in q (q is a natural number) photoelectric conversion units different from the n photoelectric conversion units, the q being greater than the p.

13. A method for driving an imaging system, the imaging system including an imaging device including a plurality of analog signal output units each including a pixel, analog-digital conversion units provided so as to correspond to the analog signal output units, and a microlens array having a plurality of microlenses, and an optical system that collects light onto the imaging device, the pixel including at least n (n is a natural number of 2 or more) photoelectric conversion units of photoelectric conversion units each provided so as to correspond to one of the microlenses, the method comprising:

a step in which the analog signal output unit outputs a first signal that is a noise signal in the analog signal output unit, a second signal based on signal charge generated by m (m is a natural number satisfying a relational expression of n>m) photoelectric conversion units among the n photoelectric conversion units, and a third signal based on signal charge generated by the n photoelectric conversion units, and the analog-digital conversion unit converts each of the first, second, and third signals into a digital signal, wherein the analog-digital conversion unit generates a first difference signal between the digital signal converted from the second signal and the digital signal converted from the first signal, and a second difference signal between the digital signal converted from the third signal and the digital signal converted from the first signal, and wherein the digital signal converted from the first signal is commonly used in both generating the first difference signal and generating the second difference signal;

a first step in which the imaging device generates the first difference signal between the digital signal converted from the second signal and the digital signal converted from the first signal, and the second difference signal between the digital signal converted from the third signal and the digital signal converted from the first signal, by using the same digital signal converted from the first signal; and a second step of obtaining a third difference signal that is a difference between the first difference signal and the second difference signal, and performing focal point detection by a phase difference detection using the third difference signal and the first difference signal.

14. The method for driving an imaging system according to claim 13, wherein the imaging device further includes color filters having colors provided so as to correspond to the plurality of photoelectric conversion units, wherein the first step is a step of obtaining the first difference signal and the second difference signal on the basis of the first signal and on the basis of the second and third signals that are based on the signal charge generated by the n and m photoelectric conversion units at which the color filters having the same color are provided.

15. The method for driving an imaging system according to claim 14, wherein the color filters having the same color are provided at the n photoelectric conversion units included in the first pixel and the second pixel, wherein the first step is a step of obtaining, for each of the first pixel and the second pixel, the first difference signal and the second difference signal on the basis of the first, second, and third signals, and wherein the second step is a step of obtaining the third difference signal for the first pixel, and performing focal point detection on the basis of the first difference signal and the third difference signal for the first pixel, and on the basis of the second difference signal for the first pixel and the second difference signal for the second pixel.

* * * * *